(12) United States Patent
Hiwada

(10) Patent No.: US 7,540,596 B2
(45) Date of Patent: Jun. 2, 2009

(54) ELECTRIC DEVICE WHERE ACTUATOR UNIT AND PRINTED WIRING BOARD ARE CONNECTED USING BONDING PARTS

(75) Inventor: Shuhei Hiwada, Toyoake (JP)

(73) Assignee: Brother Kogyo Kabushiki Kaisha, Nagoya-shi (JP)

(*) Notice: Subject to any disclaimer, the term of this patent is extended or adjusted under 35 U.S.C. 154(b) by 344 days.

(21) Appl. No.: 11/113,576

(22) Filed: Apr. 25, 2005

(65) Prior Publication Data
US 2005/0237365 A1 Oct. 27, 2005

(51) Int. Cl.
B41J 2/05 (2006.01)
B41J 2/045 (2006.01)

(52) U.S. Cl. .............................. 347/71; 347/58; 347/59
(58) Field of Classification Search ............. 347/58–59, 347/148; 438/21; 439/61
See application file for complete search history.

(56) References Cited

U.S. PATENT DOCUMENTS

| 5,652,608 | A | 7/1997 | Watanabe et al. |
| 6,027,366 | A * | 2/2000 | Mori et al. ............... 439/495 |
| 6,040,529 | A * | 3/2000 | Takeshita et al. ......... 174/254 |
| 6,345,887 | B1 | 2/2002 | Sato |
| 6,497,477 | B1 | 12/2002 | Nakamura et al. |
| 6,891,314 | B2 | 5/2005 | Sato et al. |
| 6,913,349 | B2 * | 7/2005 | Hirota ..................... 347/72 |
| 2003/0112298 | A1 * | 6/2003 | Sato et al. ................ 347/68 |
| 2003/0156157 | A1 | 8/2003 | Suzuki et al. |

FOREIGN PATENT DOCUMENTS

| JP | 01209786 A * | 8/1989 |
| JP | 4-3350 | 3/1992 |
| JP | 06-047915 | 2/1994 |
| JP | 11-254670 | 9/1999 |
| JP | 2000-135789 | 5/2000 |
| JP | 2003-069103 | 3/2003 |
| JP | 2003-311953 | 11/2003 |

* cited by examiner

Primary Examiner—Matthew Luu
Assistant Examiner—Lisa M Solomon
(74) Attorney, Agent, or Firm—Reed Smith LLP

(57) ABSTRACT

There is disclosed an electric device comprising: an actuator unit which includes a plurality of electrodes formed thereon; a printed wiring board which comprises: an electrically insulating flexible layer which has on one of its opposite sides protrusions for the respective electrodes, each of the protrusions forming a corresponding recess on the other side of the flexible layer; and a plurality of electrically conducting layers disposed on the respective protrusions to be in contact with the respectively corresponding electrodes; and a plurality of bonding parts each of which is in contact with one of the conducting layers and a corresponding one of the electrodes to completely cover a contact portion between the conducting layer and the electrode so as to maintain the contact therebetween.

20 Claims, 19 Drawing Sheets

MAIN SCANNING DIRECTION    SUB SCANNING DIRECTION

ELECTRIC DEVICE WHERE ACTUATOR UNIT AND PRINTED WIRING BOARD ARE CONNECTED USING BONDING PARTS

INCORPORATION BY REFERENCE

The present application is based on Japanese Patent Application No. 2004-130166, filed on Apr. 26, 2004, the content of which is incorporated herein by reference.

BACKGROUND OF THE INVENTION

1. Field of the Invention

The present invention relates to an electric device including an actuator unit for performing printing by ejecting ink droplets onto a recording medium.

2. Description of Related Art

In an inkjet printhead used in an inkjet printer, as an example of an actuator unit used in an electric device, ink supplied from an ink tank is distributed to a plurality of pressure chambers, and ink droplets are ejected by application of pressure in the form of pulses selectively for the respective pressure chambers. As such an actuator unit, one comprising a laminate of a plurality of piezoelectric sheets of piezoelectric ceramic can be used.

JP-A-2003-311953 discloses an arrangement where a plurality of such actuator units are supported in an inkjet head unit. Each of the actuator units is constructed such that continuous flat piezoelectric sheets are interposed among a plurality of common electrodes extending across a plurality of pressure chambers while a plurality of individual electrodes, each comprising a main portion and an auxiliary portion at which voltage is applied from the outside, are disposed at positions corresponding to the respective pressure chambers. In the inkjet head unit, the individual electrodes are electrically connected to a flexible printed wiring board or a flexible printed circuit board (FPC). The FPC has a plurality of connection pads positionally corresponding to the auxiliary electrode portions, and each of the connection pads is bonded to a corresponding one of the auxiliary electrode portions with a solder or other conductive materials. A portion of the piezoelectric sheets, which is interposed among the individual and common electrodes and polarized in the direction of stacking of the piezoelectric sheets and common and individual electrodes, expands and contracts in the stacking direction by the piezoelectric longitudinal effect, when the electrical potential at the individual electrodes is differentiated from that of the common electrodes by application of drive voltage via the FPC. Accordingly, the inner volume of the corresponding pressure chamber is changed to eject an ink droplet from a nozzle communicated with the pressure chamber onto a recording medium.

Recently, to meet the demand for printing at a higher resolution and higher speed, the pressure chambers have come to be arrayed in a high density, decreasing a bonding area between each connection pad of the FPC and the auxiliary electrode portion. This leads to a contact between adjacent two solder bumps each connecting the pad and the auxiliary electrode portion, causing a short-circuit between the individual electrodes. The amount or volume of the solder bonding the pad and the auxiliary electrode portion may be reduced to prevent the solder bump from running off an edge of the bonding area in order to prevent this contact between the solder bumps. However, this now deteriorates the strength of the bond between the pad and the auxiliary electrode portion, causing an electrical disconnection due to separation of the pad from the auxiliary electrode portion.

Meanwhile, JP-A-4-33550 discloses an FPC of an inkjet printer where a terminal of each of conducting layers constituting a conductor pattern is disposed at a position to be opposed to a piezoelectric patch. The terminal has a portion protruding toward the piezoelectric patch. The FPC is pushed or pressed by a fixing member via an elastic member such that the protrusions of the respective terminals of the FPC are held in contact with the respectively corresponding piezoelectric patches. Although it is possible to electrically connect an FPC with a piezoelectric patch without using solder in this way, such an arrangement requires additional members to press the FPC against the piezoelectric patch, namely, the elastic member, fixing member, etc., making the structure of the head unit or apparatus using the head unit relatively complex. Further, the arrangement where the protrusions of the terminals of the FPC are kept pressed onto the piezoelectric patches by the pressing force of the elastic member and fixing member leads to damage of the piezoelectric patch having a low mechanical strength.

SUMMARY OF THE INVENTION

The present invention has been developed in view of the above-described situations, and it is an object of the invention to provide an electric device in which an actuator unit and a printed wiring board are connected by bonding parts, and which inhibits occurrence of a short-circuit between electrodes due to a contact between bumps of solder or other conductive materials, while simplifying a structure of the electric device, or apparatus using the electric device, and preventing damage of the actuator unit.

To attain the above object, the invention provides an electric device comprising: an actuator unit which includes a plurality of electrodes formed thereon; a printed wiring board which comprises: an electrically insulating flexible layer which has on one of its opposite sides protrusions for the respective electrodes, each of the protrusions forming a corresponding recess on the other side of the flexible layer; and a plurality of electrically conducting layers disposed on the respective protrusions to be in contact with the respectively corresponding electrodes; and a plurality of bonding parts each of which is in contact with one of the conducting layers and a corresponding one of the electrodes to completely cover a contact portion between the conducting layer and the electrode so as to maintain the contact therebetween.

According to this arrangement, the bonding part functions to hold the state where the conducting layer on the protrusion contacts the electrode. Thus, the volume of the conductive material used to maintain the contact between the conducting layer and the electrode can be reduced. Hence, an occurrence of a short-circuit between the electrodes due to a contact between two adjacent bumps of a conductive material can be inhibited. Further, since the state where the conducting layer on the protrusion contacts the electrode is held by the bonding part, an external force required for holding this state can be provided by a relatively simple structure such that the bonding part completely covers the contact portion therebetween, or the contact portion is surrounded by the bonding part, which structure does not require any additional member which would otherwise make the structure of the electric device or the apparatus using the electric device complex. Thus, it is enabled to simplify the structure of the electric device or apparatus as well as inhibit damage of the actuator unit even when the mechanical strength thereof is low.

An example of the actuator unit is a recording head such as a printhead which may be, for instance, a thermal head or inkjet head, a magnetic head which may be used, for instance, in a radio-cassette player/recorder or HDD, and an optical head for a CD or DVD player/recorder. Other examples of the actuator unit are a reading unit, and an image sensor such as of a scanner or digital camera, namely, CMOS sensor, CCD sensor, and the like. When the actuator unit constitutes a printhead, the electric device may be a head unit including the printhead. The printhead usually has a plurality of printing elements each of which includes an actuating portion which is deformable or of other types. When the actuator unit constitutes an inkjet printhead, the inkjet printhead may be of any type, for instance, thermal piezoelectric, and electrostatic type. The printing element of a piezoelectric inkjet printhead comprises an actuating portion, a pressure chamber and a nozzle.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 7A is an enlarged view of a portion of an actuator unit as encompassed by a chain line in FIG. 6, while

FIGS. 11A-11D and FIGS. 12A-12C show a manufacturing process of the FPC, in which:

FIG. 11A shows a state where copper foil is formed on an entire surface of a base film;

FIG. 11B shows a state where etching has been performed on the copper foil on the base film, after a photoresist has been formed on the copper foil;

FIG. 11C shows a state where a conductor pattern formed on the base film is revealed with the photoresist removed;

FIG. 11D shows a state where a plated layer is formed on the conductor pattern;

FIG. 12A shows a state where the base film on which the conductor pattern with the plated layer formed thereon is placed on a die;

FIG. 12B shows a state where the base film with the conductor pattern and the plated layer, is pressed by a punch; and FIG. 12C shows in enlargement the FPC taken out from between the die and punch;

FIGS. 13A and 13B show a process of bonding the FPC to the actuator unit, in which FIG. 13A shows a state where a protrusion and a land are positioned to be opposed to each other, and FIG. 13B shows a state where a terminal is in contact with, and bonded to, the land;

FIG. 19A shows in enlargement a state where an adhesive is yet to be transferred onto the protrusion of the FPC, while

DETAILED DESCRIPTION OF PREFERRED EMBODIMENTS

Hereinafter, there will be described presently preferred embodiments of the invention, by referring to the accompanying drawings.

First Embodiment

Figure 1:
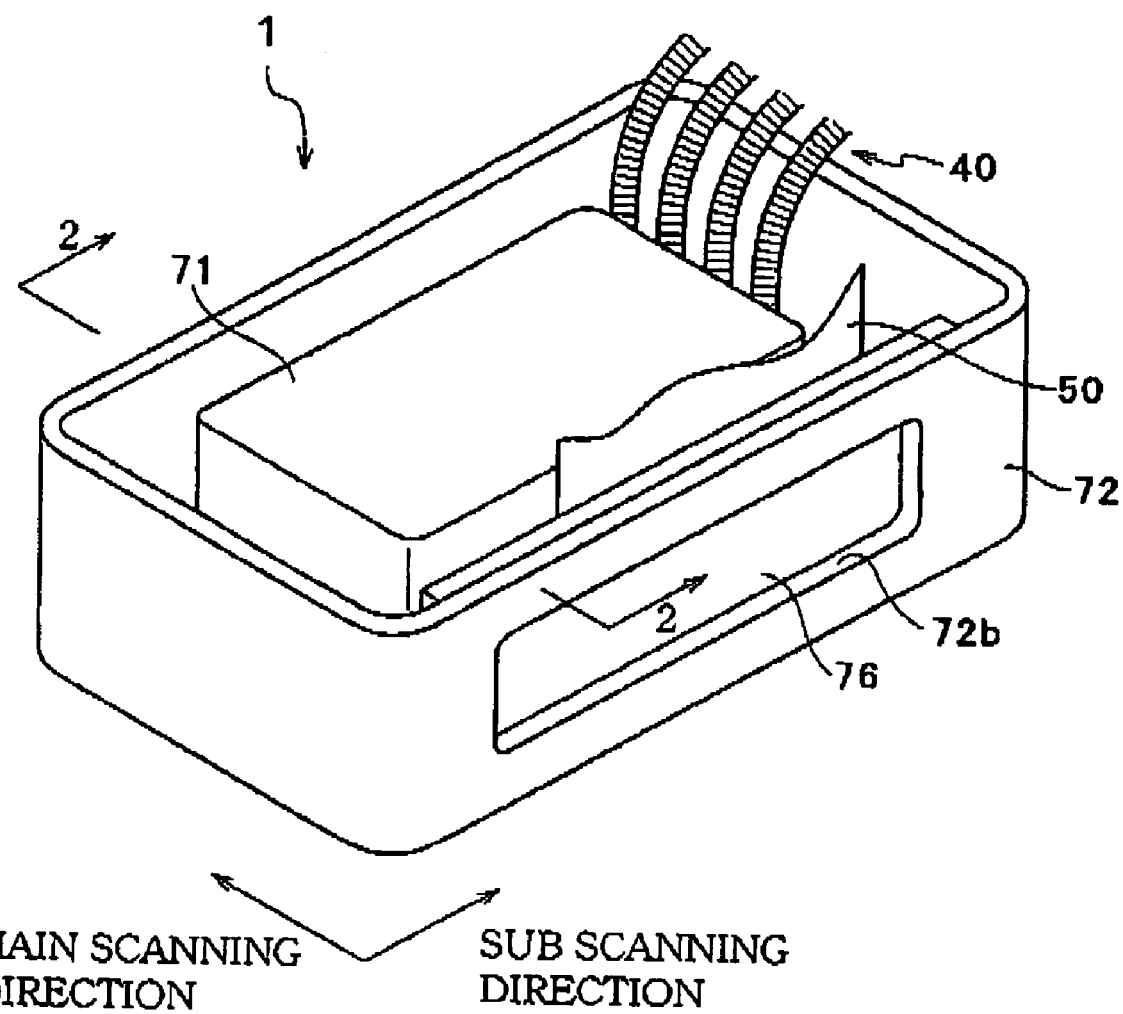
FIG. 1 is a perspective external view schematically showing an inkjet head unit according to a first embodiment of the present invention.
Figure 2:
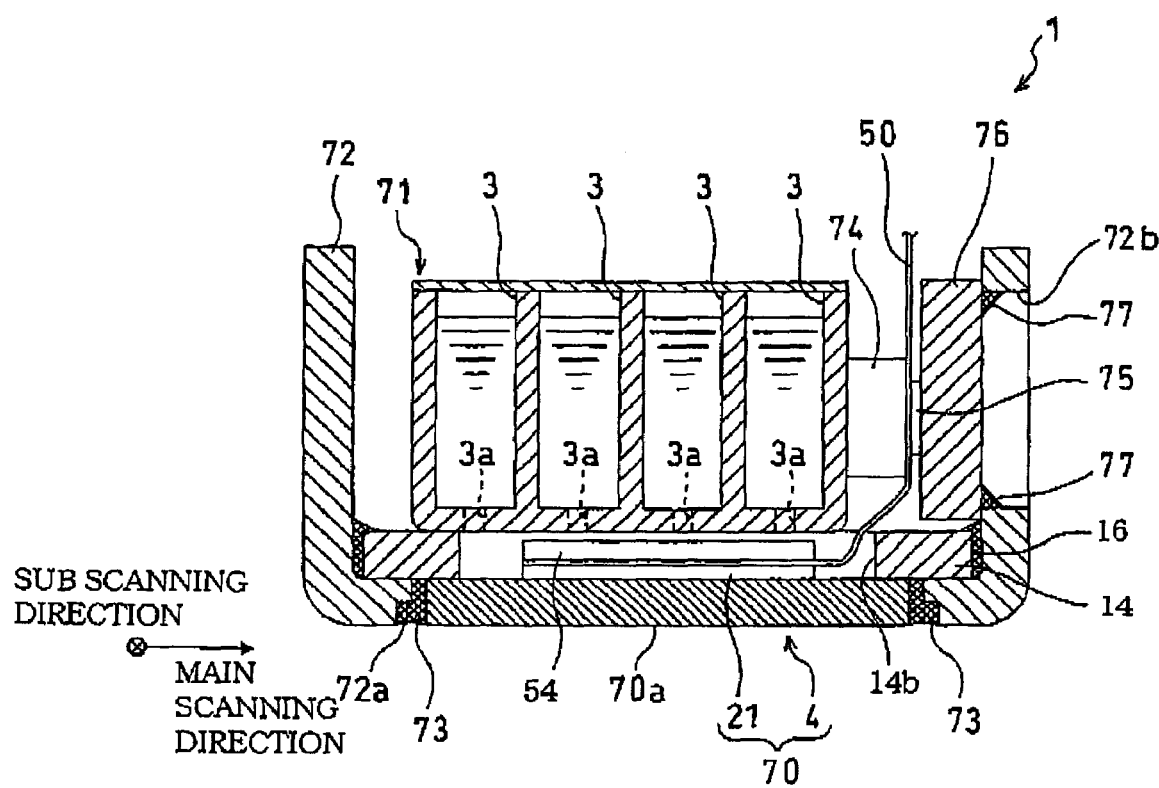
FIG. 2 is a cross-sectional view of the head unit of FIG. 1, taken along a line 2-2 in FIG. 1.
Figure 3:
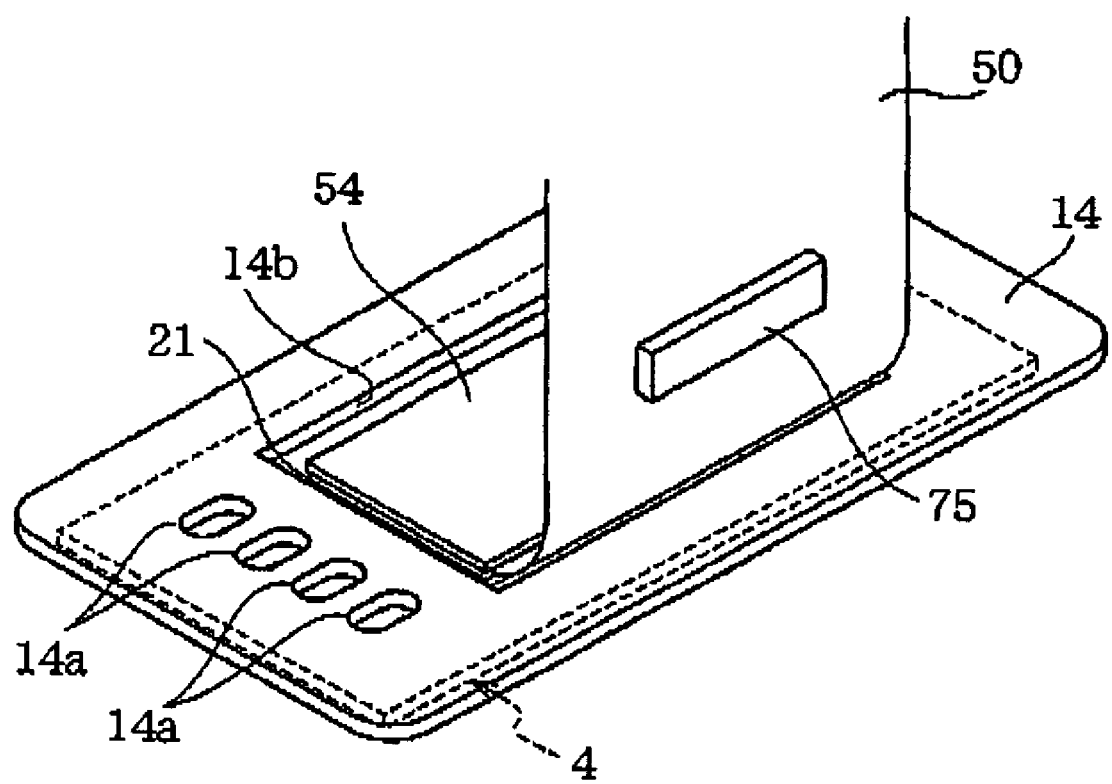
FIG. 3 is a perspective view showing a state where a reinforcing plate is bonded to a printhead of the head unit.

FIG. 1 is an external perspective view of an inkjet head unit according to a first embodiment of the invention. FIG. 2 is a cross-sectional view taken along a line 2-2 in FIG. 1, showing a state where a printhead is mounted on a holder as a component of the inkjet head unit. FIG. 3 is a perspective view showing a state where a reinforcing plate is bonded to the printhead shown in FIG. 2.

An inkjet head unit 1 is used in a serial inkjet printer (not shown), and constructed to perform recording by ejecting inks of four colors (cyan, magenta, yellow, and black) onto a recording sheet which is fed in along a sub scanning direction. As shown in FIGS. 1 and 2, the head unit 1 comprises an ink tank 71 in which four compartments 3 for separately storing the four color inks are defined, a printhead 70 disposed below the ink tank 71, and a flexible printed wiring board or a flexible printed circuit board (FPC) 50 attached to the printhead 70.

In the ink tank 71, the four compartments 3 are aligned in a main scanning direction. In FIG. 2, the compartments for the magenta ink, yellow ink, cyan ink, and black ink are arranged in the order of description left to right. The four compartments are connected to ink cartridges (not shown) via tubes 40 as shown in FIG. 1, to be supplied with inks of respective colors in the ink cartridges. The ink tank 71 is attached to a reinforcing plate 14 having a rectangular shape, as shown in FIGS. 2 and 3. This reinforcing plate 14 is bonded with a UV cure adhesive 16 to a holder 72 of a substantially rectangular shape. The reinforcing plate 14 has a rectangular opening 14*b* formed therethrough as shown in FIG. 3, and is bonded to the printhead 70 such that an actuator unit or piezoelectric actuator 21 described below is disposed in the opening 14*b*. Four ink outflow channels 3*a* are formed through a bottom wall of the ink tank 71 to be in communication with the respectively corresponding compartments 3 of the ink tank 71, and four oblong through-holes 14*a* are formed through the reinforcing plate 14 as shown in FIG. 3, to be in communication with the respectively corresponding ink outflow channels 3*a*.

The printhead 70 comprises a passage unit 4 and the actuator unit 21 and is disposed under the ink tank 71. In the passage unit 4, a plurality of ink passages for the color inks are formed. The actuator unit 21 is bonded to an upper surface of the passage unit 4 with an epoxy thermosetting adhesive. Each of the passage unit 4 and the actuator unit 21 is made up of a plurality of thin layers stacked and bonded to one another.

Figure 4:
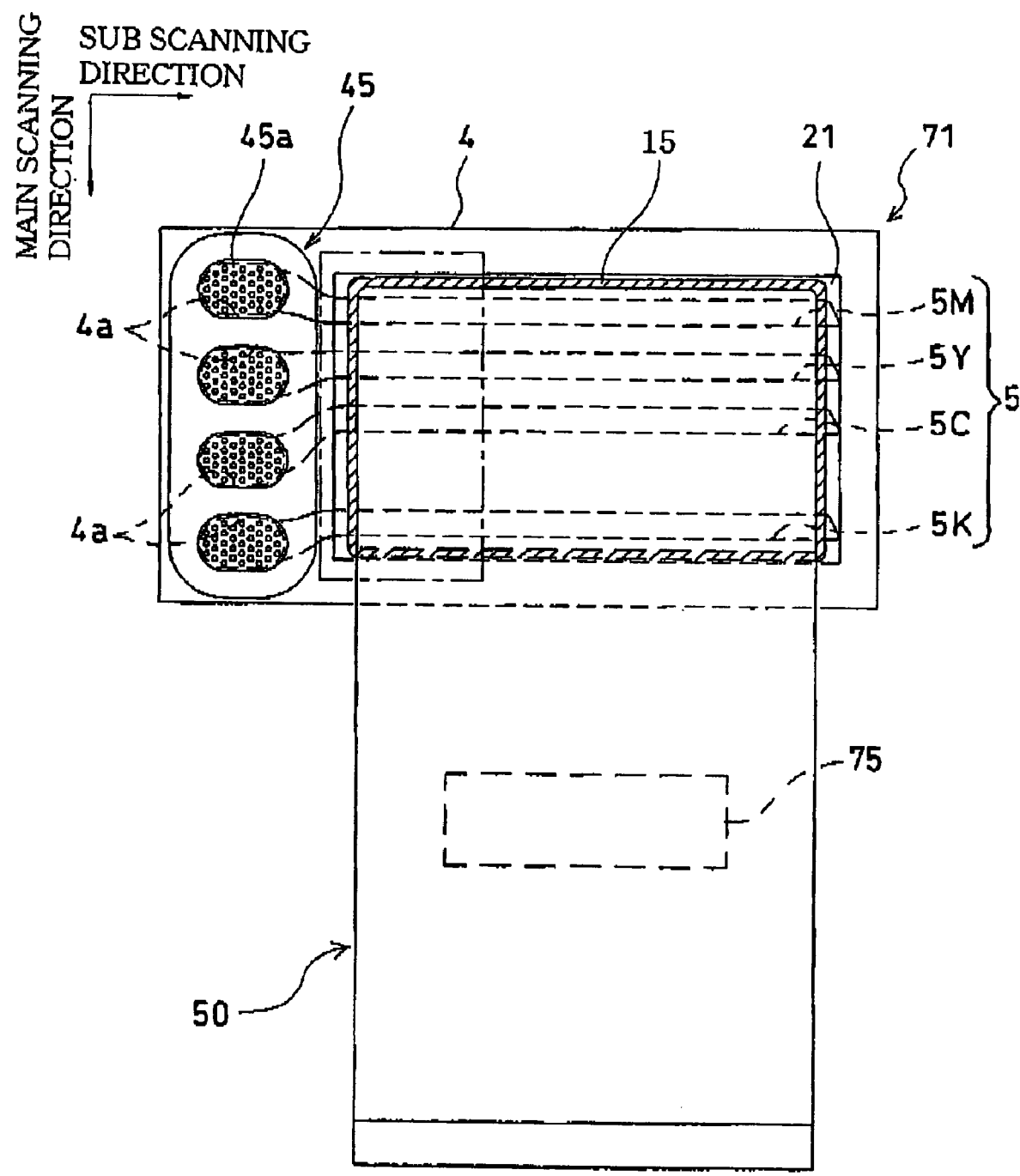
FIG. 4 is a plan view of the printhead shown in FIG. 2.

As shown in FIG. 4, four oblong ink supply ports 4a are formed to be open in an upper surface of the passage unit 4. As shown in FIG. 3, the passage unit 4 is bonded to the reinforcing plate 14 such that the through-holes 14a formed through the reinforcing plate 14 are in communication with the respectively corresponding ink supply ports 4a of the passage unit 4. Thus, the four color inks are respectively drawn from the ink tank 71 through the ink outflow channels 3a of the ink tank 71, and supplied to the inside of the passage unit 4 through the ink supply ports 4a of the passage unit 4, via the through-holes 14a of the reinforcing plate 14.

Figure 6:
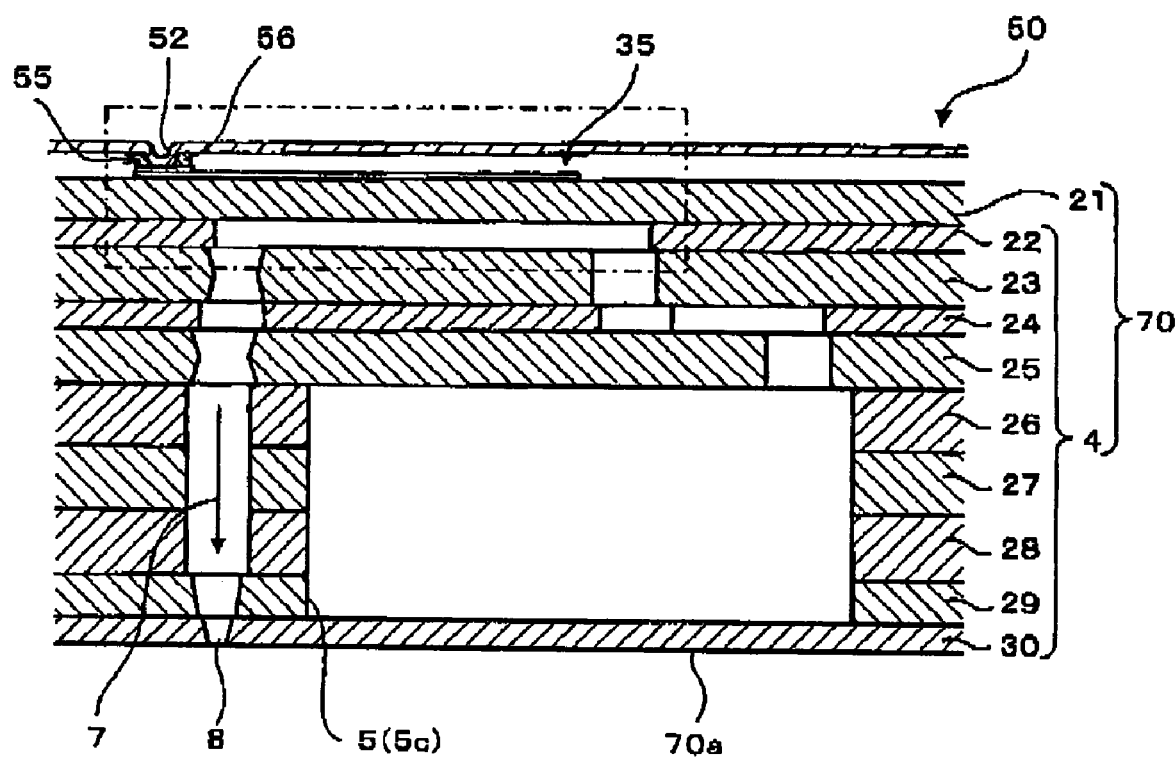
FIG. 6 is a cross-sectional view of the printhead as taken along a line 6-6 in FIG. 5.
Figure 7A:
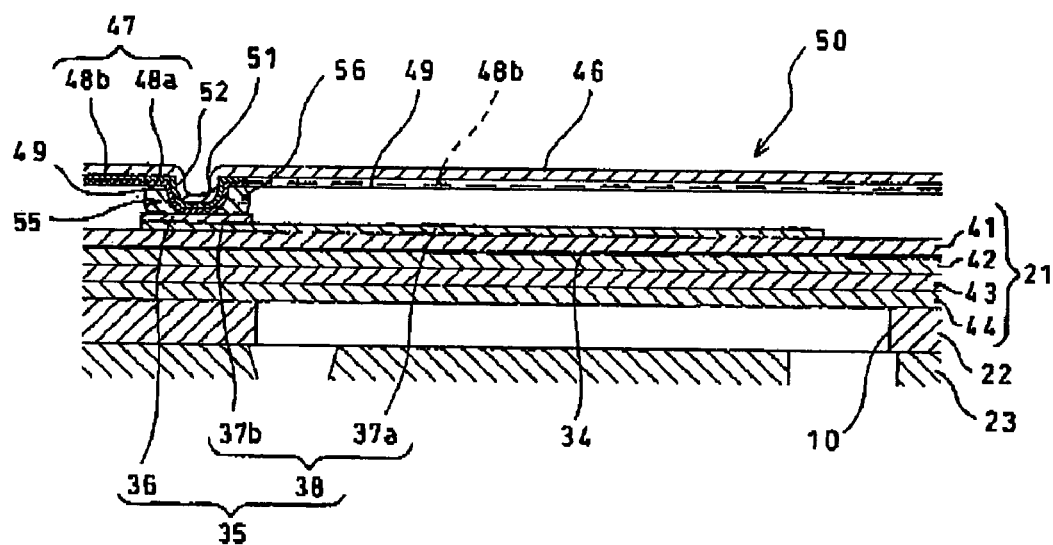

The holder 72 has an opening 72a formed through its bottom wall. The opening 72a has a step in the direction of the thickness of the bottom wall. The passage unit 4 of the printhead 70 is disposed in the stepped opening 72a, spaced from an internal side surface of the stepped opening 72a, with an ink ejection surface 70a of the passage unit 4 exposed to the outside. A clearance between the passage unit 4 and the internal side surface of the stepped opening 72a is filled with a sealing agent 73. The ink ejection surface 70a is constituted by a bottom face of the printhead 70, and multiple nozzles 8 of a minute diameter are arrayed in the ink ejection surface 70a, as shown in FIG. 6. An end of the FPC 50 in the main scanning direction is bonded to an upper surface of the actuator unit 21 with a thermosetting adhesive 56, as shown in FIG. 7A. From the upper surface of the actuator unit 21, the FPC 50 extends upward, by being once bent, through a space on one of two sides of the ink tank 71 that are opposite in the main scanning direction. A protecting layer 54 for protecting the FPC 50 and actuator unit 21 is provided on an upper side of the part of the FPC 50 bonded to the actuator unit 21.

The FPC 50 bonded at its end to the actuator unit 21 further extends along the side of the ink tank 71 with an elastic member 74 such as a sponge material interposed between the FPC 50 and the ink tank 71. A driver IC 75 is disposed on the FPC 50, which is electrically connected to the actuator unit 21 (fully described below) of the printhead 70 such that drive signals outputted from the driver IC 75 are transferred to the actuator unit 21.

As shown in FIG. 2, an opening 72b is formed through a side wall of the holder 72 opposed to the driver IC 75 for releasing heat generated at the driver IC 75. Further, a substantially rectangular heatsink 76 formed of an aluminum sheet is disposed between the driver IC 75 and the part of the side wall of the holder 72 where the opening 72b is formed. The heatsink 76 is in contact with the driver IC 75. By the provision of the heatsink 76 and the opening 72b, heat generated at the driver IC 75 is released well. A sealing agent 77 is disposed inside the opening 72b to seal between the side wall of the holder 72 and the heatsink 76, in order to prevent introduction of any foreign matter such as ink into the head unit 1.

FIG. 4 is a plan view of the printhead 70 having a rectangular flat shape long in the sub scanning direction. As shown in FIG. 4, in the passage unit 4 are formed four manifold channels 5 extending parallel to each other along the longitudinal direction of the passage unit 4. The manifold channels 5 respectively receive the inks from the compartments 3 of the ink tank 71 through the ink supply ports 4a. In the present embodiment, a manifold channel 5M for magenta ink, a manifold channel 5C for cyan ink, a manifold channel 5Y for yellow ink, and a manifold channel 5K for black ink are formed in the order of description from top down as seen in FIG. 4. A filtering member 45 is disposed on the upper surface of the passage unit 4 at a position to cover the ink supply ports 4a. The filtering member 45 comprises filters 45a each having numerous pores and disposed to cover one of the ink supply ports 4a. Hence, foreign particles or the like included in the inks supplied from the ink tank 71 to the passage unit 4 are filtered out by the filters 45a of the filtering member 45.

The actuator unit 21 having a rectangular shape as seen from its upper side, is bonded to a central portion of an upper surface of the passage unit 4, without covering the ink supply ports 4a. A part of the bottom face of the passage unit 4 positionally corresponding to a bonding area between the actuator unit 21 and the passage unit 4 constitutes an ink ejection area across which the numerous nozzles 8 (one of which is shown in FIG. 6) are arrayed. In the passage unit 4, a large number of pressure chambers 10 (one of which is shown in FIG. 6) and voids 60 are formed across the bonding area, arranged in a matrix. In other words, the actuator unit 21 has dimensions capable of covering all the pressure chambers 10 and voids 60.

As shown in FIG. 4, an annular sealing member 15 is disposed on the upper surface of the actuator unit 21, so as to encircle a part of a surface of the FPC 50 which is opposed to the actuator unit 21. More specifically, the sealing member 15, which is formed of silicon rubber, is disposed between the actuator unit 21 and the opposed part of the FPC 50 to extend along an upper, lower, left and right edge of the opposed part of the FPC as seen in FIG. 4. The lower edge of the opposed part is located on the side of the IC driver 75. By the sealing member 15, a space between the actuator unit 21 and the FPC 50 is sealed. Therefore, the ink, water in the atmosphere, and ink mist are not introduced into the space between the actuator and the FPC 50.

Figure 5:
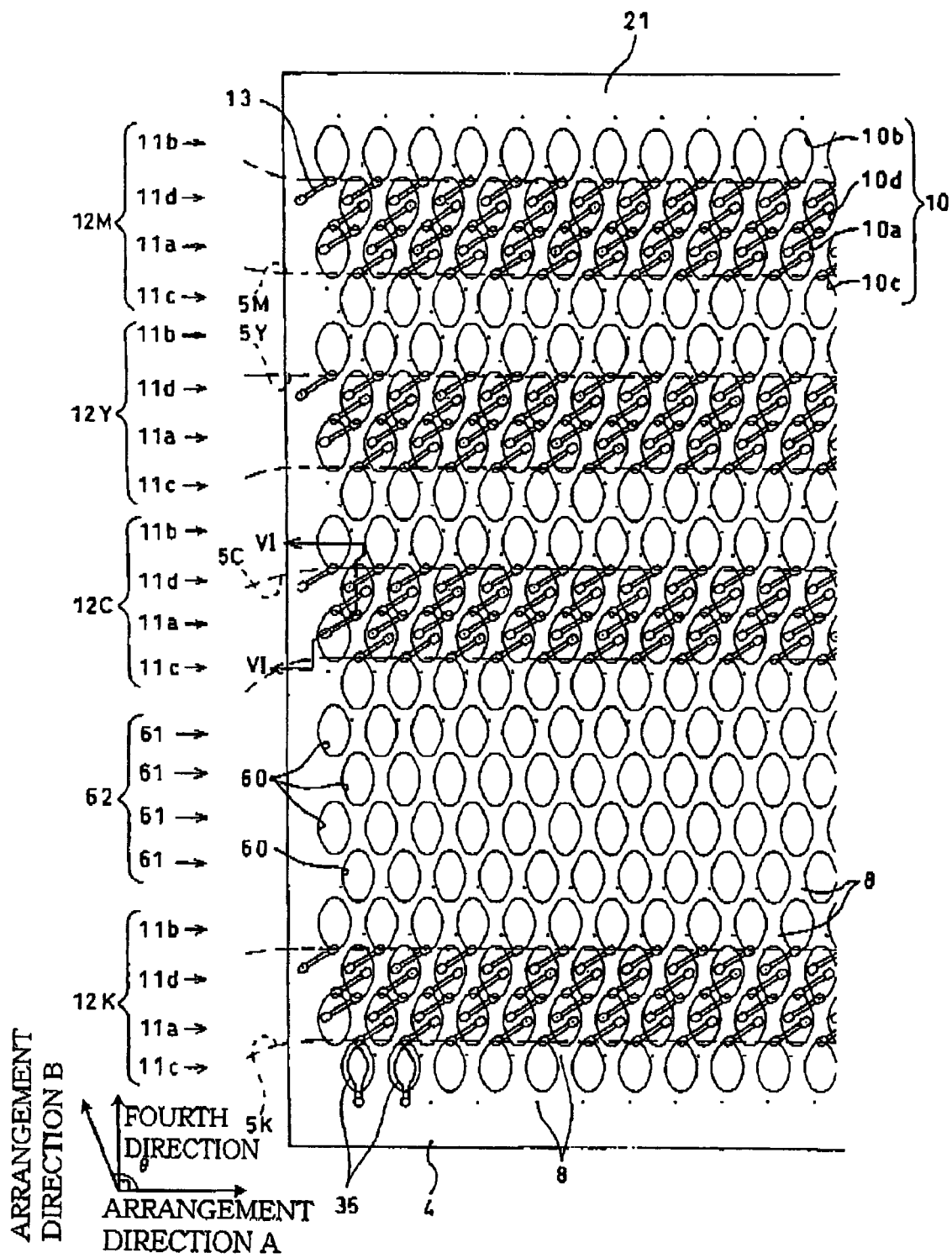
FIG. 5 shows in enlargement a part of the printhead encompassed by a chain line in FIG. 4.

FIG. 5 is an enlarged view of the area encompassed by a chain line in FIG. 4. In the passage unit 4, there are formed 16 pressure-chamber rows 11 each of which consists of a plurality of pressure chambers 10, and four void rows 61 each of which consists of a plurality of voids 60 and extends parallel to the pressure-chamber rows 11, The sixteen pressure-chamber rows 11 is divided into two clusters, namely, a first cluster consisting of 12 rows of them and a second cluster consisting of four rows of them. The first and second clusters of the pressure-chamber rows 11 are disposed on the opposite sides of the void rows 61 as a cluster. As shown in FIG. 5, the pressure chamber 10 and void 60 are identical in shape and size, but not identical in function. However, the numerous pressure chambers 10 and voids 60 are orderly arrayed without distinction in one certain arrangement pattern, in the passage unit 4.

As seen from its upper side, each pressure chamber 10 formed in the passage unit 4 has a substantially rhomboid shape with rounded corners whose major diagonal is parallel to the width direction of the passage unit 4, i.e., the main scanning direction. One of two opposite ends, in the direction of the major diagonal, of each pressure chamber 10 is in communication with one of the nozzles 8, and the other of the opposite ends is in communication with a corresponding one of the manifold channels 5 via an aperture 13. In this way, a large number of individual ink passages 7 (one of which is shown in FIG. 6) are formed to communicate the pressure chambers 10 with the respectively corresponding nozzles 8, while connected to the manifold channels 5. In FIG. 5, to facilitate understanding of the invention, the pressure chambers 10, voids 60, apertures 13, and nozzles 8 are represented by solid lines although these members are inside the passage unit 4 and normally represented by broken lines.

FIG. 6 is a cross-sectional view taken along a line 6-6 in FIG. 5, showing one of the individual ink passages 7. As can be seen in FIG. 6, each nozzle 8 is in communication with a corresponding one of the manifold channels 5 via a corresponding pressure chamber 10 and aperture or orifice 13. That is, there is formed a passage extending from a manifold channel 5 to a nozzle 8 via an aperture 13 and a pressure chamber 10. In this way, an individual ink passage 7 for each pressure chamber 10 is formed in the printhead 70.

The printhead 70 is a laminate of 10 sheet materials, namely, the actuator unit 21, a cavity plate 22, a base plate 23, an aperture plate 24, a supply plate 25, manifold plates 26-29, and a nozzle plate 30, that are superposed on one another in the order of description from top down. Among these sheet materials, nine sheet materials except the actuator unit 21 constitute the passage unit 4.

The actuator unit 21, which will be fully described later, is constituted by four piezoelectric sheets 41-44 stacked as shown in FIG. 7. The uppermost one 41 of the four piezoelectric sheet 41-44 has portions each of which functions as an actuating portion upon application of an electric field. It is noted that each actuating portion, its corresponding pressure chamber and nozzle constitute a printing element as a kind of a recording element. The other sheets 42-44 without such an actuating portion function as non-active layers. The cavity plate 22 is a metallic sheet having numerous rhomboid openings that constitute the pressure chambers 10 and voids 60, and are formed across the bonding area at which the passage unit 4 is bonded to the actuator unit 21. The base plate 28 is a metallic sheet having first openings and second openings. Each of the first openings communicates one of the pressure chambers 10 formed in the cavity plate 22 with a corresponding one of the apertures 13, and each of the second openings communicates one of the pressure chambers 10 with a corresponding one of the nozzles 8.

The aperture plate 24 is a metallic sheet having openings constituting the apertures 13 for the respective pressure chambers 10, and openings for communicating the pressure chambers 10 with the respectively corresponding nozzles 8. The supply plate 25 is a metallic sheet having openings for communicating the apertures 13 with the respectively corresponding manifold channels 5, and openings for communicating the pressure chambers 10 with the respectively corresponding nozzles 8. The manifold plates 26-29 are metallic sheets each having openings constituting the manifold channels 5, and openings for communicating the pressure chambers 10 with the respectively corresponding nozzles 8. The nozzle plate 30 is a metallic sheet having openings constituting the nozzles 8 for the respective pressure chambers 10.

The ten sheets and plates 21-30 are stacked, properly positioned relatively to one another to form the individual ink passages 7, one of which is shown in FIG. 6. Each individual ink passage 7 extends from a manifold channel 5 first upward and then horizontally at the aperture 13, and again upward to the pressure chamber 10 where the individual ink passage 7 extends horizontally. The individual passage 7 then extends downward obliquely in a direction away from the aperture 13, to the nozzle 8.

As seen in FIG. 6, the pressure chamber 10 and the aperture 13 are formed at different levels with respect to the stacking of the sheets and plates, that is, formed in different plates. This makes it possible to dispose each aperture 13 in the passage unit 4 opposed to the actuator unit 21, at a position to overlap, as seen from the upper side, another pressure chamber 10 different from the pressure chamber 10 in communication with the each aperture 13, as can be seen in FIG. 5. Accordingly, the pressure chambers 10 can be arranged close to one another, achieving an arrangement in high density. Thus, image printing at a high resolution is made possible even with an inkjet head unit 1 whose ink ejection surface is relatively small.

Referring back to FIG. 5, each pressure chamber 10 is communicated at one of opposite ends of its major diagonal with the nozzle 8, and at the other end of its major diagonal with the manifold channel 5. As will be described later, individual electrodes 35 (shown in FIGS. 7A and 7B) each having a substantially rhomboid shape as seen from the upper side, which is one size smaller than that of the pressure chamber 10, are arranged in a matrix on the upper surface of the actuator unit 21 to positionally correspond to the respective pressure chambers 10. In FIG. 5, only two individual electrodes 35 are presented for simplicity.

Each of the voids 60 is formed in the cavity plate 22 by closing, with the actuator unit 21 and the base plate 23, an opening having the same shape and size as those of the pressure chamber 10 formed in the cavity plate 22. Thus, the void 60 is neither connected to an ink passage nor filled with the ink. The voids 60 are arranged in a matrix, more specifically, arrayed in a fashion staggered in two arrangement directions, namely; a direction A (a first direction) and a direction B (a second direction). The voids 60 are arranged in four parallel rows 61 together forming a void cluster 62. The pressure chambers 10 are formed in the passage unit 4 with the void cluster 62 interposed between the two clusters of the pressure chambers 10.

In the present embodiment, the pressure chamber 10 and the void 60 are identical in shape and size, and arranged in the same fashion. As a whole, the pressure chambers 10 and voids 60 are arranged in a matrix of the pattern staggered in the arrangement directions A and B. The direction A is parallel to a longitudinal direction of the inkjet head unit 1 or the passage unit 4, and to a minor diagonal of the pressure chamber 10. The arrangement direction B is parallel to an inclined side of the rhomboid shape of the pressure chamber 10, and forms an obtuse angle θ with the arrangement direction A.

The pressure chambers 10 are arranged in a matrix or aligned along the arrangement directions A and B, at intervals in the arrangement direction A which corresponds to an employed degree of resolution. For instance, to have the nozzles arranged in a density to enable printing at a resolution of 150 dpi, the pressure chamber 10 are arranged in a density of 37.5 dpi in the arrangement direction A.

The pressure chambers 10 are arranged within the bonding area between the actuator unit 21 and the passage unit 4 such that 16 pressure chambers 10 are arranged along the arrangement direction B with four voids 60 interposed, and eight pressure chambers 10 are arranged along a fourth direction orthogonal to the arrangement direction A as seen in a third direction which is perpendicular to the surface of the sheet where FIG. 5 is presented, with two voids 60 interposed.

The numerous pressure chambers 10 are arranged in the matrix comprising the pressure-chamber rows 11 each extending in the arrangement direction A as shown in FIG. 5. The pressure-chamber rows 11 are classified into four groups of rows based on their positions relative to the respectively corresponding manifold channels 5 as seen in the third direction. Namely, first row group 11a, second row group 11b, third row group 11c, and fourth row group 11d. The pressure-chamber rows 11 of the first through fourth groups 11a-11d are cyclically arranged in an order of 11c-11a-11d-11b, from one of opposite sides in the width direction of the actuator unit 21 to the other side (i.e., from bottom up as seen in FIG. 5), such that each four rows 11c, 11a, 11d, 11b form a set 12 of pressure-chamber rows 11. Four sets 12 of pressure-chamber rows 11 are thus made, and all the pressure chambers 10 belonging to each set 12 are communicated with one of the manifold channels 5 via the respective apertures 18. That is, each set 12 of the pressure chambers 10 corresponds to one of the manifold channels 5, and accordingly four sets 12M, 12Y, 12C, 12K of the pressure chambers 10 are formed for the respective color inks, so that when the actuator unit 21 changes the inner volume of each pressure chamber 10 belonging to one of the sets 12M, 12Y, 12C, 12K, a droplet of ink of the corresponding color is ejected from the nozzle 8.

Each of the nozzles 8 communicated with the pressure chambers 10a, 10c of the pressure-chamber rows of the first and third groups 11a, 11c, is disposed on the lower left side, in the fourth direction, of the communicated pressure chamber 10a, 10c, or on the left side of a lower end of the pressure chamber 11a, 10c. On the other hand, each of the nozzles 8 communicated with the pressure chambers 10b, 10d of the pressure-chamber rows of the second and fourth groups 11b, 11d, is disposed on the upper right side, in the fourth direction, of the communicated pressure chamber 10, or on the right side of an upper end of the pressure chamber 10. In the pressure-chamber rows 11a, 11d of the first and fourth groups, more than a half of each pressure chamber 10a, 10d overlaps with the manifold channel 5 as seen in the third direction. On the other hand, in the pressure-chamber rows 11b, 11c of the second and third groups, almost an entirety of each pressure chamber 10b, 10c is located outside the manifold channel 5 as seen in the same direction. Thus, it is enabled to smoothly supply the inks to the pressure chambers 10 by widening the manifold channels 5 and preventing all the nozzles 8 communicated with the pressure chambers 10 of rows 11a-11d, from being located under the manifold channels 5.

There will be now described a structure of the actuator unit 21 and the FPC 50. The multiple individual electrodes 35 are arranged on the actuator unit 21 in a matrix of the same arrangement pattern as the pressure chambers 10. Each individual electrode 35 is disposed at a position to be opposed to a corresponding one of the pressure chambers 10 as seen from the upper side. This orderly arrangement of the pressure chambers 10 and individual electrodes 35 facilitates designing of the actuator unit 21.

Figure 7B:
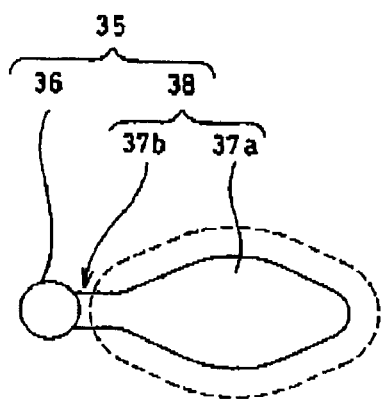
FIG. 7B is a plan view of an individual electrode of the actuator unit.
Figure 8:
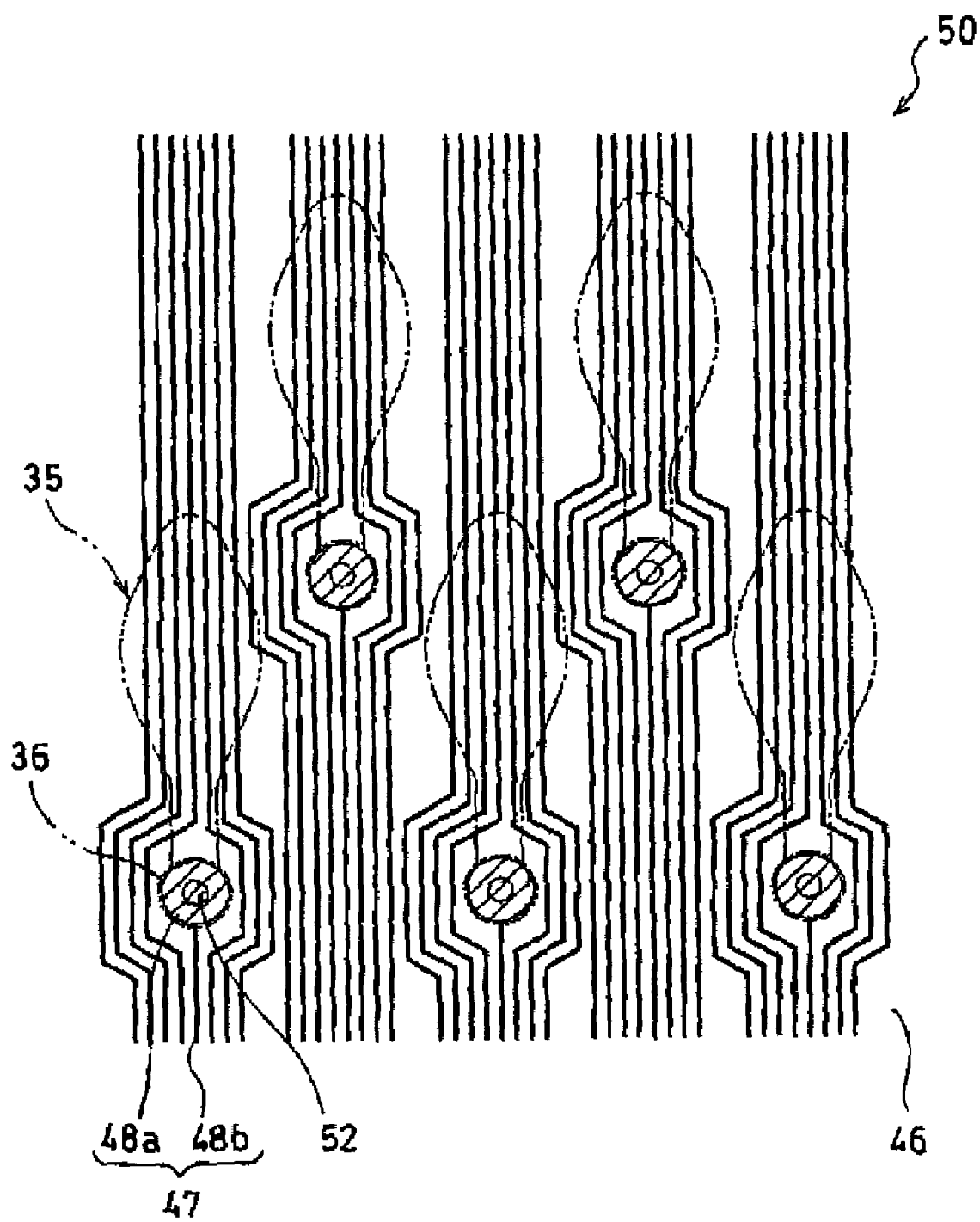
FIG. 8 is an enlarged plan view of an FPC as shown in FIG. 2.

FIGS. 7A and 7B show the actuator unit 21. FIG. 7A is an enlarged view of the part encompassed by a chain line in FIG. 6, while FIG. 7B is a plan view of the individual electrode. FIG. 8 is an enlarged plan view of an FPC 50 shown in FIG. 2. In FIG. 8, a terminal 48a and a wire 48b are represented by a solid line for simplicity, although these are inside the FPC 50 and normally represented by a broken line. As shown in FIGS. 7A and 7B, the individual electrodes 35 are disposed at respective positions to be opposed to the pressure chambers 10, and each individual electrode 35 comprises a main electrode portion 37a formed within an area of the corresponding pressure chamber 10 as seen from the upper side, and an auxiliary electrode portion 37b continuous from the main electrode portion 37a and formed outside the area of the pressure chamber 10.

As shown in FIG. 7A, the actuator unit 21 comprises the four piezoelectric sheets 41, 42, 43, 44 each having a same thickness of about 15 μm. The piezoelectric sheets 41-44 are continuous flat sheets covering the multiple pressure chambers 10 and voids 60 formed within an area corresponding to the ink ejection area or surface 70a of the printhead 70. Since the piezoelectric sheets 41-44 in the form of continuous flat sheets are disposed to cover the numerous pressure chambers 10, it is enabled to form the individual electrodes 35 on the piezoelectric sheet 41 in a high density, by screen printing for instance. This in turn enables to increase the density of the pressure chambers 10 formed at respective positions corresponding to the individual electrodes 35, realizing printing at a relatively high resolution. The piezoelectric sheets 41-44 are made of a PZT (lead-zirconate-titanate)-based ceramic material having a ferroelectricity.

The main electrode portion 35a of the individual electrode 35 formed on the uppermost piezoelectric sheet 41 has a substantially rhomboid shape almost similar to the shape of the pressure chamber 10, as shown in FIG. 7B. An acute angle portion on the left side, as seen in FIG. 7B, of the rhomboid main electrode portion 37a is extended to an area overlapping an acute angle portion of the pressure chamber 10 and connected to the auxiliary electrode portion 37b. At an end of the auxiliary electrode portion 37b is formed a circular land 36. As shown in FIG. 7B, the land 36 is disposed at a position under which a pressure chamber 10 is not present in the cavity plate 22, and has a diameter of about 0.3 mm. The land 36 is formed on the auxiliary electrode portion 37b as shown in FIG. 7B, with gold containing glass frit, for instance.

A common electrode 34 is interposed between the uppermost piezoelectric sheet 41 and the next uppermost piezoelectric sheet 42. The common electrode 34 has the same shape as the piezoelectric sheet 41 and a thickness of about 2 μm. The individual and common electrodes 34, 35 may be formed of a Ag—Pd-based metallic material, for instance.

The common electrode 34 is grounded at a place not shown, so as to be held at a constant potential, namely, the ground potential, uniformly across an area covering all the pressure chambers 10.

As shown in FIG. 7A, the FPC 50 comprises a base film or flexible layer 46, and a conductor pattern 47 formed on an undersurface (i.e., the surface opposed to the printhead 70) of the base film 46, which are laminated. In the present embodiment, the base film 46 is an electrically insulating film of polyimide resin having a flexibility. However, the base film 46 may be any other electrically insulating resin films; for instance, a resin film of polyethylene, polycarbonate, polystyrene, or polypropylene may be employed. The conductor pattern 47 is formed of copper foil.

As shown in FIG. 8, the conductor pattern 47 comprises a plurality of terminals or conducting layers 48a formed on the base film 46 at respective positions to be opposed to the lands 36, and a plurality of wires 48b each extending from a center of a lower end of one of the terminals 48a downward as seen in FIG. 8, that is, toward an end of the FPC 50 on the side of the driver IC 75. Each of the terminal 48a has a circular shape as seen from the upper side.

Each of the wires 48b has a width about one tenth of a diameter of the terminal 48a. A wire 48b extends from each terminal 48a while electrically connected therewith. The wires 48b are spaced from one another, while circumventing the terminals 48a. The wires 48b are respectively connected to the driver IC 75 disposed at a place on the FPC 50 on the side of a control circuit. On the surface of the conductor pattern 47, there is formed a plated layer 49. That is, each of the terminals 48a and wiring 48b constituting the conductor patter 47 has the plated layer 49 thereon.

As shown in FIG. 7A and FIG. 8, at the positions in the base film 46 opposed to the respective lands 36, there are formed protrusions 51 each protruding from the undersurface of the base film 46 toward approximately a center of the corresponding land 36. The protrusions 51 are formed by pressing using a punch 90 described below. By forming the protrusions 61 on the underside of the base film 46, there are formed recesses 52 conforming to the shape of the punch, on an upper surface of the base film 46 at the positions corresponding to the protrusions 51. Each of the protrusions 51 or recesses 52 constitutes a protruding portion 55 which protrudes from a central portion of the terminal 48a toward approximately the center of the land 36, as shown in FIG. 7A.

As shown in FIG. 7A, the epoxy thermosetting adhesive 56, which is made of an electrically nonconductive material and corresponds to a bonding part, is applied around the protruding portion 56. An end of the protruding portion 55 is brought into contact with the surface of the land 36 and flattened by a shrinkage force generated upon curing of the adhesive 56, and also by the cohesion of the adhesive 56 with respect to the land 36. In this way, the terminal 48a and the land 36 are electrically connected. According to this arrangement, the FPC 50 can transmit a drive signal from the driver IC 75 to each of the individual electrodes 35 via the corresponding wire 48b and terminal 48a. That is, each of the individual electrodes 35 is connected to the driver IC 75, via the terminal 48a and wire 48b exclusively for that individual electrode 35 and independent of the terminals 48a and wires 48b for the other individual electrodes 35. Thus, it is enabled to control ink ejection related to each pressure chamber independently of the other pressure chambers.

Next, there will be described a method of driving the actuator unit 21. The direction of polarization of the piezoelectric sheet 41 of the actuator unit 21 is parallel to the direction of thickness thereof. That is, the actuator unit 21 is of unimorph type where the uppermost one 41 of the piezoelectric sheets 41-44 (i.e., the one most remote from the pressure chamber 10) is formed to include actuating portions while the other piezoelectric sheets 42-44 on the lower side (i.e., the three closer to the pressure chamber 10) are not an active layer. Hence, where the directions of the electric field and the polarization are aligned and when the electric potential of a given positive or negative value is imposed at the individual electrode 35, the portion in the piezoelectric sheet 41 where the electric field is applied functions as an actuating portion (or pressure generating portion), causing the actuator unit 21 to contract in a direction perpendicular to the polarization direction by the piezoelectric transversal effect.

In the present embodiment, the portion in the piezoelectric sheet 41 interposed between each individual electrode 35 and the common electrode 34 serves as an actuating portion for deforming the actuator unit 21 upon application of an electric field due to the piezoelectric effect. On the other hand, the three piezoelectric sheets 42-44 below the piezoelectric sheet 41 are not applied with the electric field from the outside, and substantially do not serve as an actuating portion. Accordingly, the piezoelectric sheet 41 contracts mainly at the portion interposed between each main electrode portion 35a of the individual electrode 35 and the common electrode 34 in the direction perpendicular to the polarization direction by the piezoelectric transversal effect.

Since the piezoelectric sheets 42-44, which are not affected by the electric field, do not spontaneously deform, a difference in an amount of deformation in the direction perpendicular to the polarization direction occurs between the uppermost piezoelectric sheet 41 and the piezoelectric sheets 42-44 thereunder, making the laminate of the piezoelectric sheets 41-44 convex as a whole to the side of the piezoelectric sheets 42-44, which are non-active layers. That is, a morph deformation occurs. Since the undersurface of the actuator unit 21 comprising the piezoelectric sheets 41-44 is fixed to the upper surface of a partition wall or the cavity plate 22 having the through-holes constituting the pressure chambers 10, as shown in FIG. 7A, the laminate of the piezoelectric sheets 41-44 deforms to be convex toward the pressure chamber 10 in question. Thus, the inner volume of the pressure chamber 10 decreases, raising the ink pressure there and accordingly ejecting the ink from the corresponding nozzle 8. Thereafter, the electric potential at the individual electrode 35 is restored to its original value which is the same as that of the common electrode 34, with the laminate of the piezoelectric sheets 41-44 restored to its original shape, which in turn restores the inner volume of the pressure chamber 10 to its original value, thereby sucking the ink from the manifold channel 5.

There may be employed another driving method, such that the potential at the individual electrode 35 is normally set at a value different from that at the common electrode 34, and each time a request for ejection is received, the potential at the individual electrode 35 is once made the same as that of the common electrode 34, and then, at a suitable timing, returned to the initial value different from the potential of the common electrode 34. According to such a driving method, when the laminate of the piezoelectric sheets 41-44 is restored to its original shape at the timing when the electrical potentials at the common and individual electrodes 34, 35 are made equal, the inner volume of the pressure chamber 10 increases compared to that in the initial state where the electrical potentials at the common and individual electrodes 34, 35 are different from each other, Thus, the pressure chamber 10 sucks the ink from the manifold channel 5. Then, at the timing when the potential at the individual electrode 35 is again differentiated from that of the common electrode 34, the laminate of the piezoelectric sheets 41-44 are deformed to be convex toward the pressure chamber 10, raising the ink pressure in the pressure chamber 10 due to the decreased inner volume of thereof, and accordingly ejecting the ink. In this way, the inks are ejected from the nozzles 8 while the inkjet head unit 1 is appropriately moved in the main scanning direction, to print a desired image on the recording sheet.

Figure 9:
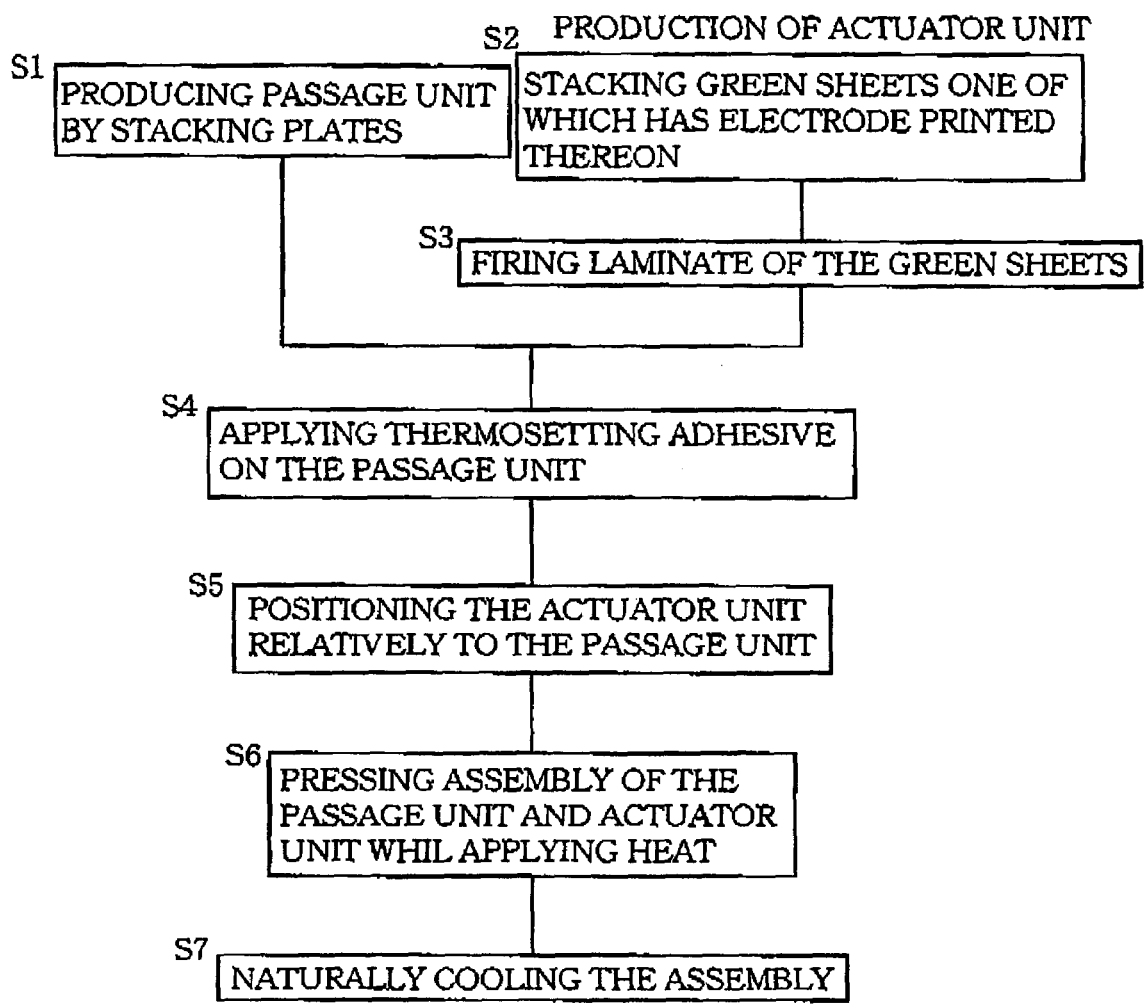
FIGS. 9 and 10 illustrate a manufacturing process of the inkjet head unit.
Figure 10:
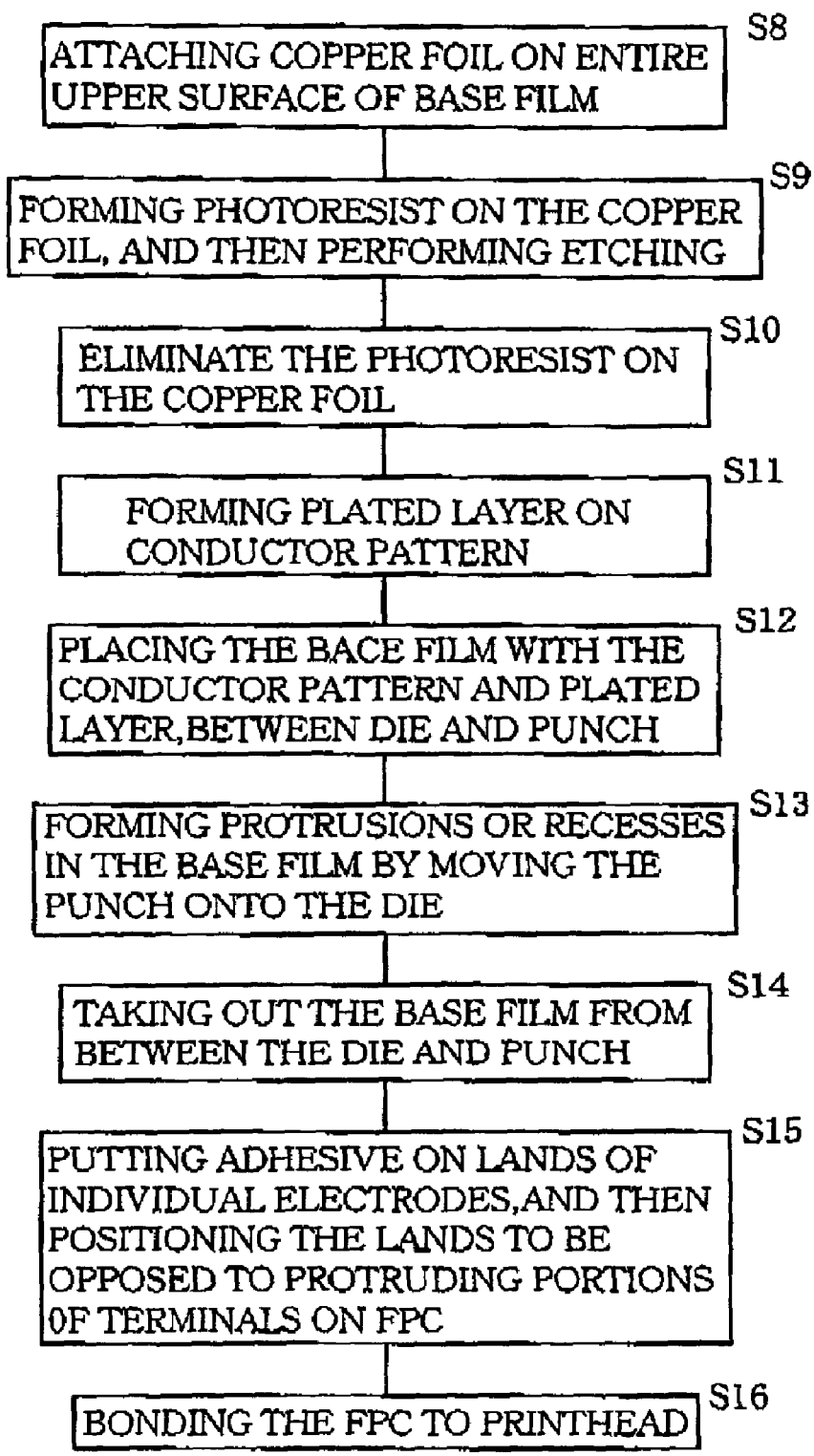

There will be now described a manufacturing method of the inkjet head unit 1, referring to FIGS. 9-13. FIGS. 9 and 10 show a process flow of production of the head unit 1. FIGS. 11A-11D show a process of producing the FPC 50. FIG. 11A shows a state where copper foil 81 is disposed over an entire surface of a base film 46, FIG. 11B shows a state where etching has been performed on the copper foil 81 on the base film 46 after formation of a photoresist on the copper foil 81, FIG. 11C shows a state where a conductor pattern 47 formed on the base film 46 is revealed by removing the photoresist, and FIG. 11D shows a state where a plated layer 49 is formed on the conductor pattern 47. FIGS. 12A and 12B show a process of producing the FPC 50. FIG. 12A shows a state where the base film 46 with the conductor pattern 47 and plated layer 49 is placed on a die 92, FIG. 12B shows a state where the base film 46 with the conductor pattern 47 and plated layer 49 is pressed by the punch 90, and FIG. 12C shows in enlargement the FPC 50 taken out from between the die 92 and punch 90. FIGS. 13A and 13B show a process of bonding the FPC 50 to the actuator unit 21. FIG. 13A shows a state where the protrusion 51 and the land 36 are positioned to be opposed to each other, and FIG. 13B shows a state where the terminal 48a is in contact with, and bonded to, the land 36 via the plated layer 49.

In production of the head unit 1, the components thereof including the passage unit 4 and actuator unit 21 are first produced separately, and then assembled into the head unit 1. The process flow is initiated with step S1, in which the passage unit 4 is produced by performing etching on each of the plates 22-30 constituting the passage unit 4 and each having a photoresist as a mask, to form the through-holes in the plates 22-30 as shown in FIG. 6. Thereafter, the nine plates 22-30 are positioned relatively to one another to form the individual ink passages 7 and bonded to one another with an epoxy thermosetting adhesive. The nine plates 22-30 are heated to a temperature higher than the curing temperature of the thermosetting adhesive, while applied with pressure, thereby curing the thermosetting adhesive to fix the nine plates 22-30 to one another. In this way, the passage unit 4 as shown in FIG. 6 can be obtained.

Meanwhile, to produce the actuator unit 21, a plurality of green sheets of piezoelectric ceramic are prepared in step S2. Each green sheet is formed to have dimensions taking into consideration shrinkage of the green sheet during a firing process. An electrically conductive paste is applied on one of the green sheets in a pattern of the common electrode 34 by screen printing. One of the green sheet on which the patter of the common electrode 34 is not printed with the conductive paste is superposed on the green sheet with the common electrode pattern of the conductive paste, which is superposed on the remaining two green sheets on each of which the common electrode pattern of the conductive paste is not printed, while relatively positioning all the green sheets using a jig.

In step S3, the laminate obtained in step S2 is degreased in a way well-known in the art, and then fired at a given temperature. Thus, four green sheets are fired into the piezoelectric sheets 41-44, and the conductive paste into the common electrode 34. Thereafter, a conductive paste is applied in a pattern of electrode layers 38 on the uppermost one 41 of the piezoelectric sheets, by screen printing. Then, the paste is fired by subjecting the laminate of the piezoelectric sheets 41-44 to a heat treatment, thereby forming the electrode layers 38 on the piezoelectric sheet 41. Thereafter, gold including glass frit is printed on the auxiliary electrode portion 37b of each of the electrode layers 38 to form the land 36. The individual electrodes 35 are thus formed on the piezoelectric sheet 41. In this way, the actuator unit 21 as shown in FIG. 7 is produced.

Since the process of producing the passage unit 4 in step S1 and the process of producing the actuator unit in steps S2 and S3 can be implemented independently of each other, either of the production processes may be implemented prior to the other, or alternatively the two processes may be implemented concurrently.

In the next step S4, on a surface of the passage unit 4 obtained in step S1 in which multiple recesses constituting the pressure chambers are formed, an epoxy thermosetting adhesive whose thermosetting temperature is about 80° C. is applied with a bar coater. As this thermosetting adhesive, a two component adhesive is employed, for instance.

Thereafter, in step S5, the actuator unit 21 is mounted on the layer of the thermosetting adhesive on the passage unit 4. The actuator unit 21 is positioned relatively to the passage unit 4 such that the actuating portions of the actuator unit 21 and the pressure chambers 10 of the passage unit 4 positionally correspond to each other. This positioning is performed based on a positioning mark (not shown) provided on the passage unit 4 and the actuator unit 21 in advance during the preparation or production processes (steps S1-S3) thereof.

In the next step S6, the laminate constituted by the passage unit 4, thermosetting adhesive between the passage unit 4 and actuator unit 21, and actuator unit 21 is pressed in a heating presser (not shown) while being heated to a temperature beyond the thermosetting temperature of the thermosetting adhesive. In step S7, the laminate is taken out of the heating presser to be naturally cooled. In this way, the printhead 70 comprising the passage unit 4 and the actuator unit 21 is produced.

Figure 11A:
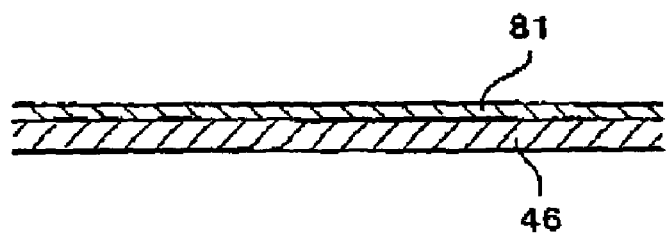
Figure 11B:
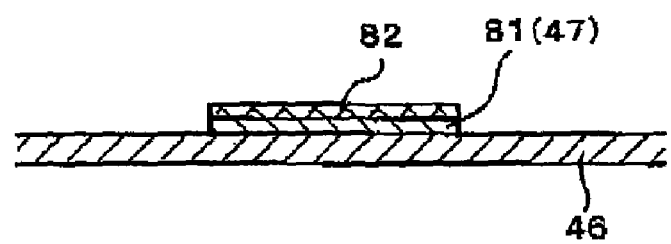

Next, the process of producing the FPC 50 will be described, In step S8, there is prepared the base film 46 to one of whose opposite sides, namely, its upper side, the copper foil 81 is bonded over an entirety of the side via an adhesive, as shown in FIG. 11A. In step S9, to form the conductor pattern 47 as shown in FIG. 11B, a photoresist 82 is formed on the copper foil 81 to subject the copper foil 81 to etching to eliminate a part of the copper foil 81 which does not constitute the conductor pattern 47.

Figure 11C:
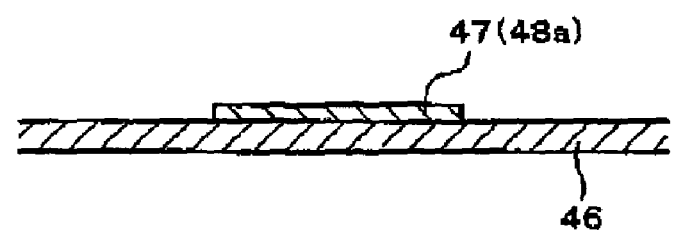
Figure 11D:
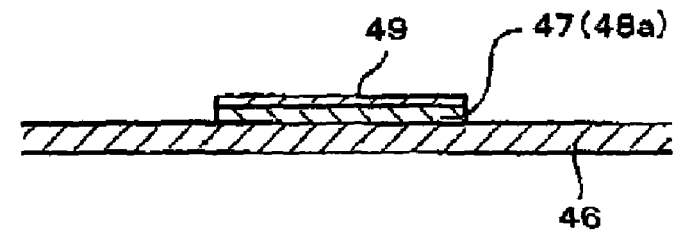

In the next step S10, the photoresist 82 on the conductor pattern 47 is removed as shown in FIG. 11C. In step S11, the plated layer 49 of gold is formed by electrolytic plating on the conductor pattern 47 as shown in FIG. 11D.

In the next step S12, the base film 46 with the conductor pattern 47 and plated layer 49, is disposed between the die 92 having semispherical recesses 93 and a punch 90 with protrusions 91 each in a very narrow needle-like shape with a rounded tip, such that each terminal 48a of the conductor pattern 47 is opposed to a corresponding one of the recesses 93 of the die 92, and the plated layer 49 is brought into contact with an upper surface of the die 92 at positions corresponding to a peripheral portion of each terminal 48a, and the wires 48b.

Figure 12A:
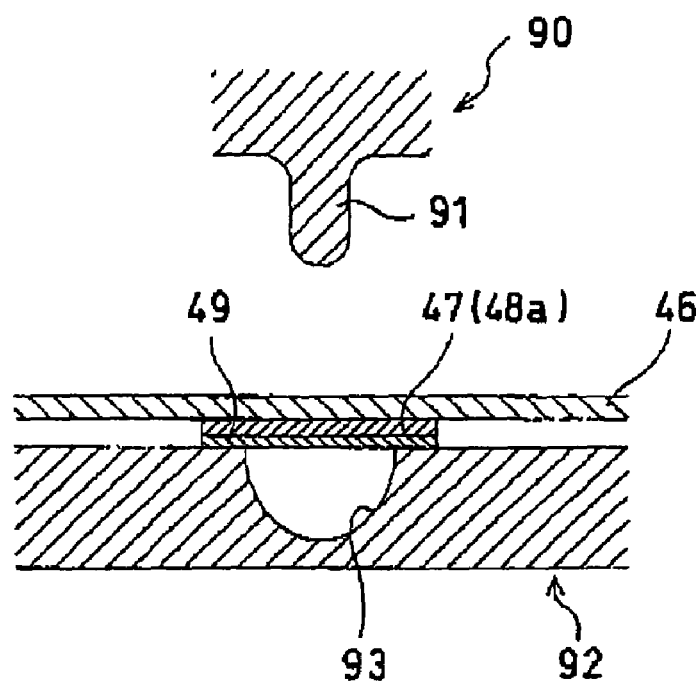
Figure 12B:
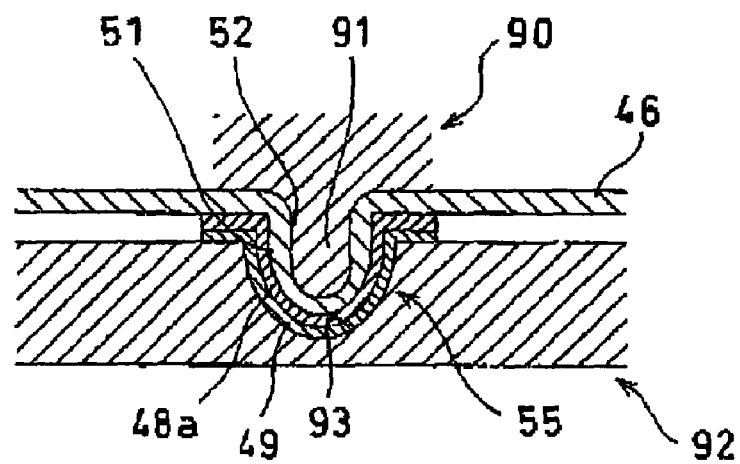

Next, in step S13, the punch 90 is moved toward the die 92, that is, in the vertically downward direction as seen in FIG. 12B, with the tip of each protrusion 91 of the punch 90 pressed onto a center of the corresponding recess 93, so as to deform a portion of the base film 46 on which the terminal 48a is formed, to be inside the recess 93. By thus pressing the base film 46 using a die set or the punch 90 and die 92, the protrusions 51 corresponding to the recesses 52 are formed in the base film 46, thereby providing the protruding portions 56 at centers of the respective terminals 48a.

Figure 12C:
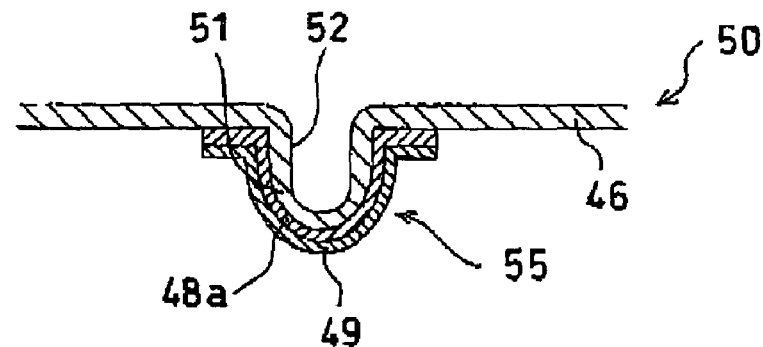

In step S14, the base film 46 is taken out of the die set 90, 92, as shown in FIG. 12C. With this step S14, the process of producing the FPC 50 where the protruding portions 55 are formed in the terminals 48a is finished.

Figure 13A:
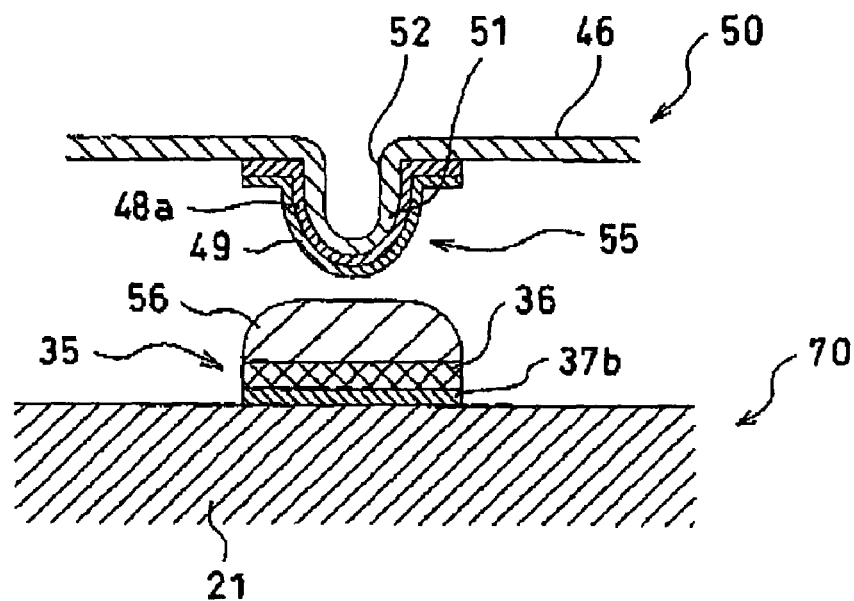

In the next step S15, after the epoxy thermosetting adhesive 56 is applied on the lands 36, the FPC 50 is positioned over the actuator unit 21 such that the lands 36 of the individual electrodes 35 and the respectively corresponding protruding portions 55 of the terminals 48a are opposed to each other, as shown in FIG. 13A.

Figure 13B:
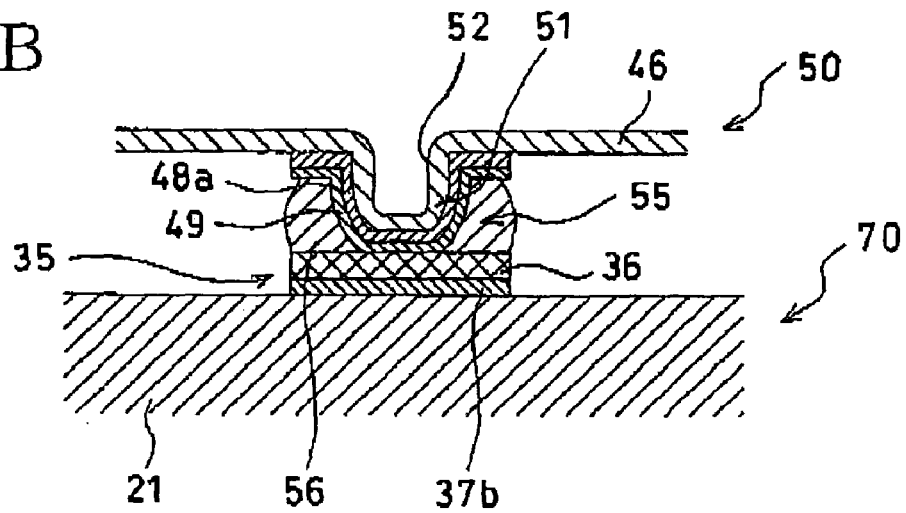

Then, in step S16, an end of each protruding portion 55 is pressed onto the land 36 to be thereby elastically deformed while the actuator unit 21 of the printhead 70 is subjected to a preliminary heating process to cure the adhesive 56 so as to provisionally bond the FPC 50 to the printhead 70, as shown in FIG. 13B. Since the lands 36 and the plated layer 49 are both formed of gold, an oxide film does not tend to be formed between the terminals 48a and the lands 36. Accordingly, the electrical connection therebetween is made more reliable. Thereafter, the pressing force imposed on the FPC 50 toward the actuator unit 21 is eliminated, and the printhead 70 and the FPC 50 are subjected to a main heating process, to thoroughly cure the adhesive 56 to fully bond the FPC 50 to the printhead 70. Although each of the protruding portions 55 of the terminals 48a will restore to its original shape by the elastic restoring force thereof, since the shrinkage force of the adhesive 56 is larger than the elastic restoring force of the protruding portion 55, the FPC 50 is bonded to the printhead 70 in a state where the end of each protruding portion 55 is in pressing contact with the corresponding land 36 of the individual electrode 35 and held flattened. The sealing member 15 is disposed to extend along an edge or circumference of the area in the upper surface of the actuator unit 21 which area overlaps with the FPC 50, such that all of the contact portions between the lands and the ends of the protruding portions 55 are located inside the annular sealing member 15, as shown in FIG. 4.

The embodiment may be modified such that the process of producing the FPC 50, namely, steps S8-S14, may be implemented in parallel with the process of producing the printhead 70 (namely, steps S1-S7) or the process of producing the passage unit 4 and actuator unit 21. Alternatively, the process of producing the FPC 50 may be implemented before the process of producing the printhead 70. Further, the embodiment may be modified such that before bonding the passage unit 4 to the actuator unit 21, the actuator unit 21 and the FPC 50 are provisionally bonded in step S16, and then the actuator unit 21 is appropriately positioned relatively to the passage unit 4 to be superposed thereon. The FPC 50, actuator unit 21, and passage unit 4 are heated all together, to bond the actuator unit 21 to the passage unit 4 as well as bond the FPC 50 to the printhead 70, to thereby produce the printhead 70. According to this method, the heat treatment of step S6 and that of step S16 are implemented at a time, reducing the number of implementations of heat treatment, by one. Accordingly, the process of producing the head unit 1 can be shortened.

Further, the embodiment may be modified such that before the lands 36 are brought into contact with the terminals 48a in step S15, the adhesive 56 is applied on the lands 36 as well as the adhesive providing the sealing member 15 and of the same kind as the adhesive 56 is disposed along the edge of the area in the upper surface of the actuator unit 21 overlapping with the FPC 50, as described above. According to this modification, in step S16 in which the lands 36 and the terminals 48a are brought into contact with each other, the adhesive 56 ensures the contact between the lands 36 and the terminals 48a, while the adhesive providing the sealing member 15 seals the contact portions therebetween. That is, the adhesive constituting the sealing member 15 and disposed on the actuator unit 21 functions to isolate the contact portions from the atmosphere. It is noted that the sealing member 15 is made of silicone rubber, and may be anywise as long as all of the contacting portions between the ends of the protruding portions 55 and the lands 36 are insulated from the atmosphere. Thus, the sealing member 15 may or may not be formed of the same kind of adhesive as the adhesive 56.

In the above-described embodiment, the plated layer 49 is formed on the conductor pattern 47 which has been beforehand formed, in step 811 prior to the step for forming the protruding portions 55 of the FPC 50. However, the plated layer 49 may be formed after the formation of the protruding portions 55. Where the latter order is employed, the plated layer 49 is formed on the conductor patter 47 which already has the protruding portions 55. Hence, the plated layer 49 is formed by merely growing on the conductor pattern 47. That is, the plated layer 49 is not deformed upon formation of the protruding portions 55. This prevents an inconvenience that the plated layer 49 is damaged or separated from the substrate layer or the conductor pattern 47. Thus, an FPC 50 which is mechanically more reliable can be obtained. Further, the reliability of the electrical connection between the terminals 48a and the lands 36 can be enhanced.

Thereafter, the protective plate 54 is bonded to the FPC 50. Then, the printhead 70, the reinforcing plate 41, and the ink tank 71 are fixed to one another with the ink outflow channels 3a, through-holes 41a, and ink supply ports 4a are in communication. Thus, obtained assembly is accommodated in the holder 72 to be fixed there. Then, the elastic member 74 and the heatsink 76 are provided, to complete the above-described head unit 1.

In the FPC 50 of the head unit 1 constructed as described above, the adhesive 56 disposed around the protruding portion 55 of each terminal 48a functions to maintain the contact between the terminal 48a and the land 36. Hence, it is not necessary to use a conductive material such as solder for maintaining the contact therebetween. Accordingly, an occurrence of a short-circuit between two adjacent individual electrodes 35 due to contact between the bumps or the like of a conductive material on the individual electrodes 35. Further, according to this arrangement, an external force required for maintaining the contact between each terminal 48a and the corresponding land 36 can be exerted by the simple structure that the contact portion therebetween is completely covered by, or surrounded by, the adhesive 56 as a bonding part. Therefore, the head unit or apparatus using the head unit does not require an additional member for maintaining the contact as seen in the conventional technique disclosed in the publication mentioned above, and the head unit or apparatus is simplified. In addition, since each terminal 48a and the corresponding land 36 are held in contact to be electrically connected with each other solely by the bonding force of the adhesive 56, damage of the actuator unit 21 having a relatively low mechanical strength is prevented.

The reliability of the electrical connection between the terminal 48a and land 36 is relatively high since the end of the protruding portion 55 of the terminal 48a is in contact with the land 36 with the terminal 48a flattened. That is, the terminals 48a and the respectively corresponding lands 36 are reliably held in contact with each other, owing to that the elastic deformation of the ends of the protruding portions 55 function to accommodate a variation in height among the lands 36 due to an error in flatness of the prepared actuator unit 21, and the that the elastic restoring force generated at the end of each protruding portion 55 makes the terminal 48a and the land 36 contact each other securely. Further, since the individual electrode 35 has a two-layer structure comprising the electrode layer 38 and the land 36 and the end of the protruding portion 55 of the terminal 48a is in contact with the land 36 at which the thickness of the individual electrode 35 is the largest, the terminal 48a can be held in contact with the land 36 with relatively high pressure acting thereon, enhancing the reliability of the electrical connection between the land 36 and terminal 48a.

Since the adhesive 56 is made of an electrically nonconductive material, even when the adhesive or bonding part 66 between one of the terminals 48a and a corresponding one of the lands 36 contacts another terminal 48a or another land 36 adjacent to the bonding part 56, a short-circuit between two adjacent individual electrodes 35 does not occur.

The sealing member 15 on the upper surface of the actuator unit 21 inhibits the ink, water in the atmosphere, and ink mist from entering the space between the FPC and actuator unit 21, thereby preventing occurrence of short-circuit in the conductor pattern 47 and between the individual electrodes 35 due to migration caused by water in the atmosphere.

Second Embodiment

Figure 14:
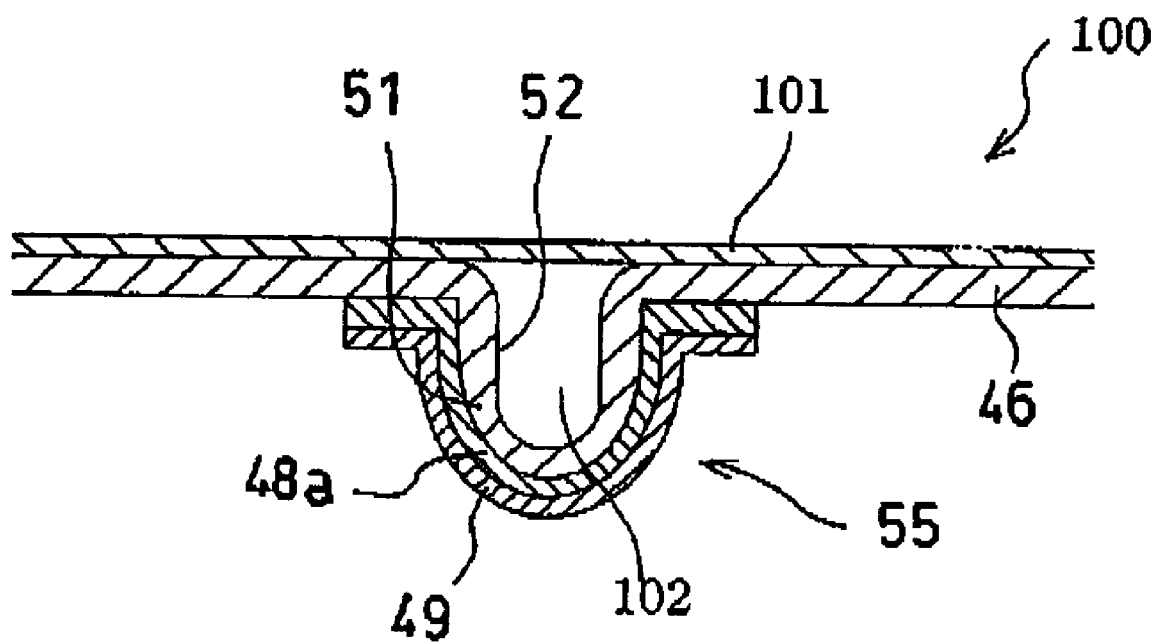
FIG. 14 shows in enlargement an FPC of an inkjet head unit according to a second embodiment of the invention.

Referring now to FIG. 14, there will be described an FPC 100 of an inkjet head unit according to a second embodiment of the invention. FIG. 14 is a cross-sectional view showing the FPC 100 in enlargement. The elements or parts identical with those of the first embodiment will be denoted by the same reference numerals and description thereof is dispensed with.

The head unit of the second embodiment has substantially the same structure as the head unit 1 of the first embodiment, but the structure of the FPC 100 is slightly different from that of the FPC 50 in the first embodiment. As shown in FIG. 14, the FPC 100 of the second embodiment has a supporting plate (supporting layer) 101 disposed on an upper surface of a base film 46 (i.e., a side of the base film 46 opposite to the side on which terminals 48a and wires 48b are formed). The other part of the FPC 100 is identical with the FPC 50 as described above.

The supporting plate 101 is a metallic sheet conforming to the shape of the surface of the FPC 100 opposed to the actuator unit 2. The supporting plate 101 is disposed on only a part of the FPC 100 at which the FPC 100 is opposed to the actuator unit 21, and bonded thereto with a thermosetting adhesive, thereby forming a closed space 102 between the supporting plate 100 and each recess 52. Thus superposing the supporting plate 101 having a relatively high rigidity on the FPC 100 facilitates handling of the FPC 100, in turn facilitating production of the inkjet head unit. That is, since the portion of the FPC 100 which is opposed to the actuator unit 21 when bonding the FPC 100 to the head, is made to tend not to bend, the positioning the protruding portions 55 of the terminals 48a of the FPC 100 relatively to the lands 36 is made easy. Further, the provision of the closed spaces 102 inside the FPC 100 increases the elastic restoring force of the terminals 48a or protruding portions 55 of the FPC 100 when the FPC 100 is bonded to the printhead 70 with the ends of the protruding portions 55 flattened by being pressed against the lands 36, since the air in the closed spaces 102 is not let out thereof. Thus, the bonding force between the terminals 48a and the lands 36 is increased, further enhancing the reliability of the electrical connection there, compared to the first embodiment.

The FPC 100 of the second embodiment can be obtained by simply superposing the supporting plate 100 on the FPC 50 of the first embodiment and bonding the plate 100 thereto. FIGS. 15-18 show in enlargement FPCs 200, 300, 400, 500 according to third, fourth, fifth and sixth embodiments of the invention, respectively, in each of which terminals 48a on the FPCs 200, 300, 400, 500 have respective structures to obtain elastic restoring forces of the terminals 48a or protruding portions 55 of different magnitudes. The elements and parts identical with those of the FPCs 50 and 100 according to the first and second embodiments will be referred to by the same reference numerals and description thereof is dispensed with.

Third Embodiment

Figure 15:
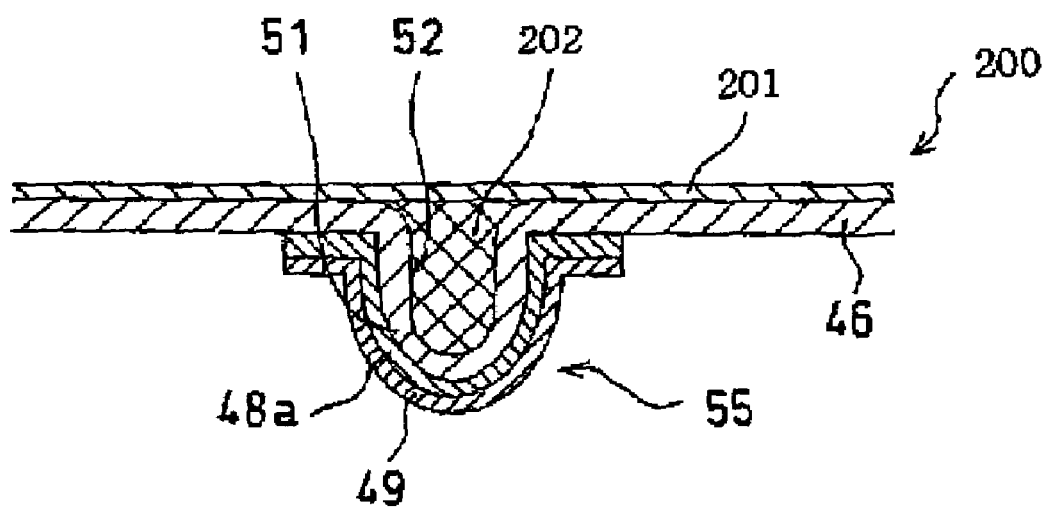
FIG. 15 shows in enlargement an FPC of an inkjet head unit according to a third embodiment of the invention.

As shown in FIG. 15, the FPC 200 of the third embodiment is configured such that each closed space 102 as described with respect to the second embodiment is filled with an elastic material 202. According to this arrangement, terminals 48a on the FPC 200 have an increased elastic restoring force compared to that of the terminals 48a in the FPC 100 of the second embodiment. Thus, the reliability of the electrical connection between the terminals 48a and lands 36 is further enhanced.

Fourth Embodiment

Figure 16:
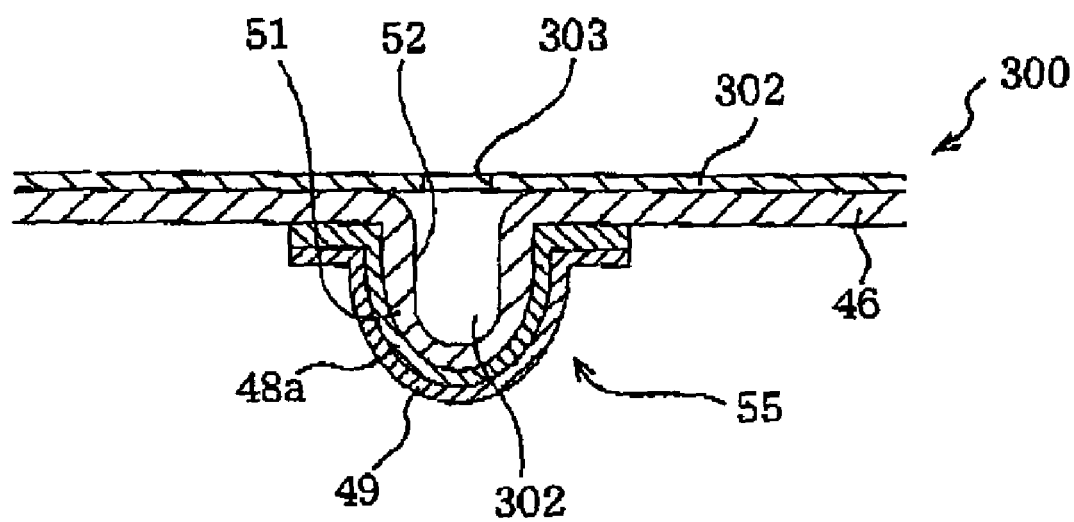
FIG. 16 shows in enlargement an FPC of an inkjet head unit according to a fourth embodiment of the invention.

Since it is not necessary to further increase the elastic restoring force of the terminals 48a or protruding portions 55 beyond a requisite level, the FPC 300 according to the fourth embodiment has a plurality of through-holes 303 formed in its supporting plate 301 at positions respectively opposed to recesses 52, as shown in FIG. 16. In this way, the closed space 102 in the second embodiment is modified to be a space 302 open to the atmosphere. However, since the supporting plate 301 is superposed on and bonded to the base film 46, the FPC 300 is made more easily handleable compared to the FPC 50 of the first embodiment.

Fifth Embodiment

Figure 17:
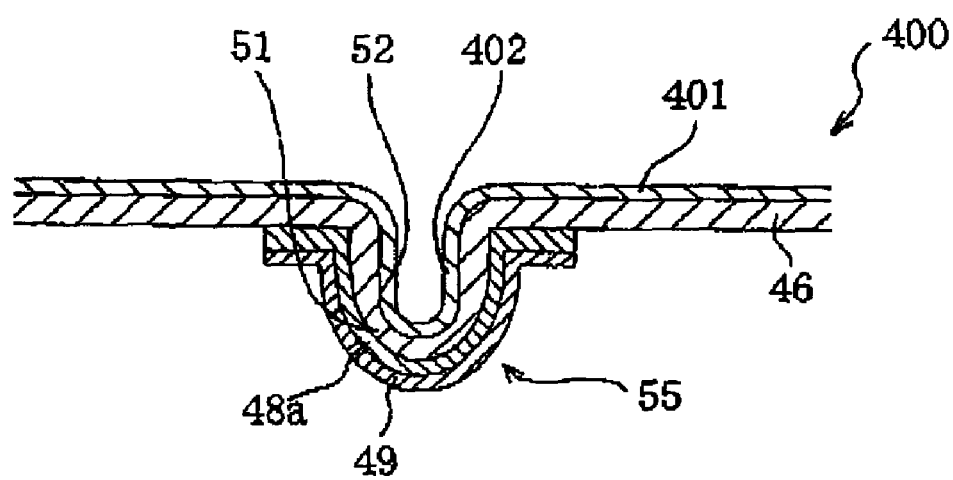
FIG. 17 shows in enlargement an FPC of an inkjet head unit according to a fifth embodiment of the invention.

As shown in FIG. 17, the FPC 400 of the fifth embodiment of the invention has a supporting plate 401 having curved portions 402 conforming to recesses 52. According to this arrangement, when a printhead 70 and the FPC 400 are bonded to each other with an end of each protruding portion 55 flattened by being held in pressing contact with a land 36, the elastic restoring force of the protruding portion 55 is enhanced compared to the second embodiment. Thus, the reliability of the electrical connection between the land 36 and terminal 48a is enhanced.

Sixth Embodiment

Figure 18:
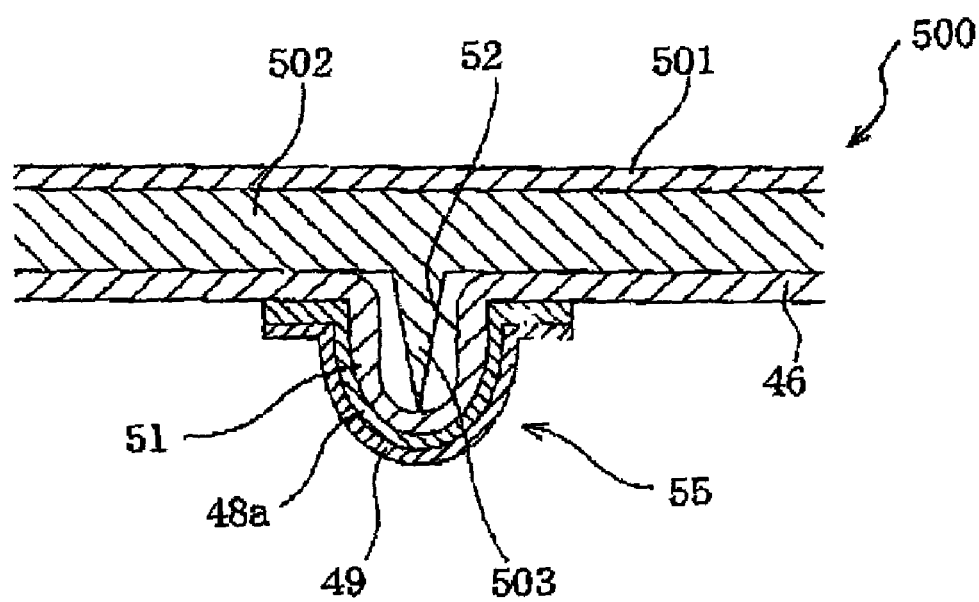
FIG. 18 shows in enlargement an FPC of an inkjet head unit according to a sixth embodiment of the invention.

As shown in FIG. 18, the FPC 500 of the sixth embodiment is formed such that an elastic member 502 is sandwiched between a supporting plate 501 and a base film 46. The elastic member 502 has protrusions 508 protruding at respective positions opposed to recesses 52 toward bottoms of the recesses 52. Each protrusion 503 has a circular conical shape tapered down toward the bottom of the recess 52. The presence of the elastic member 502, which is formed on a surface of the supporting plate 501 which surface is opposed to the base film 46, and has such protrusions 503, increases the elastic restoring force of the protruding portions 55 in the terminals 48a of the FPC 500, compared to the second embodiment, enhancing the reliability of the electrical connection between the land 36 and the terminal 48a.

Although there have been described several presently preferred embodiments of the invention, the invention is not limited to the details of the embodiments, but may be embodied with various modifications without departing from the scope of the invention as defined in the appended claims. For instance, in the first and second embodiments, it may be arranged such that the FPC 50, 100 is bonded to the printhead 70 such that the protruding portions 55 are held in contact with the lands 36 but not flattened. That is, the end of each protruding portion 55 may be merely in contact with the land 36. Further, the individual electrode 35 may be single-layered, or alternatively comprise three or more layers. In addition, the land 36 may be formed over an entire surface of the electrode layer 38.

In the first and second embodiments, a slight amount of solder may be interposed between the land 36 and the end of the protruding portion 55 of the terminal 48a. When such an arrangement is employed, the terminal 48a and the land 36 are cohesively bonded to each other at a very small area, further improving the reliability of the electrical connection therebetween. Further, the sealing member 15 may be omitted. Although in the above-described embodiments, the plated layer 49 on the terminal 48a and the land 36 is formed of gold, the plated layer 49 and the land 36 may be formed of other materials such as silver, platinum, and palladium. The electrode layer 38 also may be formed of gold, platinum or palladium.

Figure 19A:
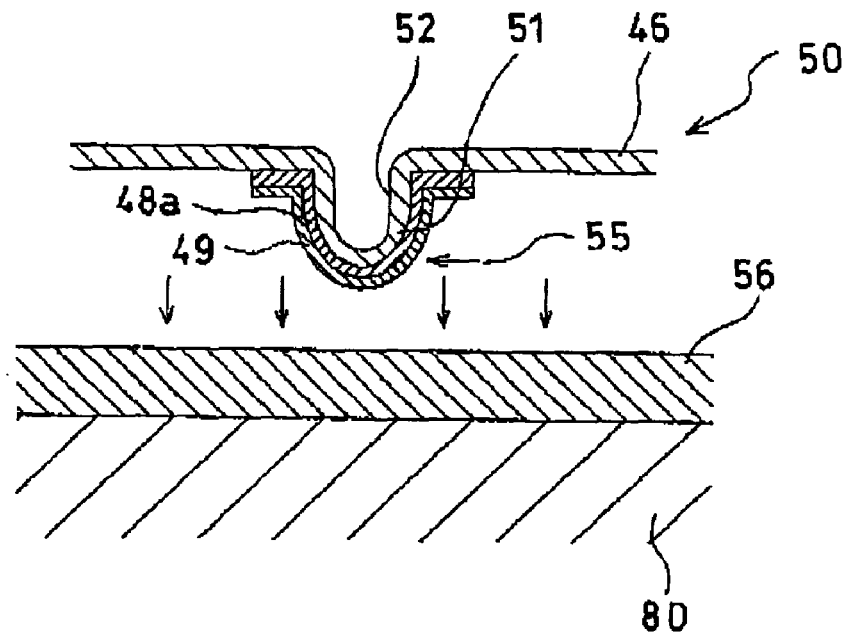
Figure 19B:
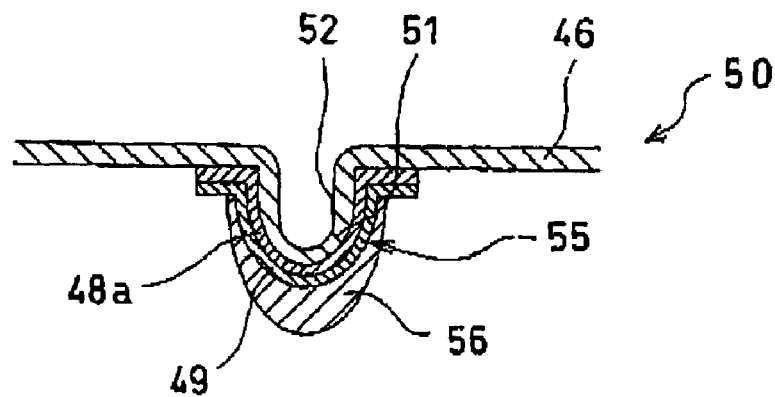
FIG. 19B shows in enlargement a state where the adhesive has been transferred onto the protrusion.

Although in the above-described embodiments the adhesive 56 for maintaining the contact between the terminal 48a and land 36 is applied on the land 36 in step S15, the adhesive 56 may be applied on the terminal 48a opposed to the land 36, not on the land 36. For instance, prior to implementation of step S15, a layer of the adhesive 56 is formed in a given thickness on a flat plate 80, as shown in FIG. 19A, and then pressed against the terminal 48a. Then, the FPC 50, 100, 200, 300, 400, 500 is separated from the flat plate 80, to transfer the adhesive 56 onto the terminals 48a, as shown in FIG. 19B. Thereafter, in steps S15 and S16, the terminals 48a and the respectively corresponding lands 36 are held in contact with each other. This method is advantageous in that the adhesive 56 can be applied precisely on a plurality of desired positions at a time. In transferring the adhesive 56 onto the terminals 48a, a thickness of the layer of the adhesive 56 formed on the plate 80 is preferably not larger than a height of the protruding portion 55, in order that the adhesive 56 is applied in a volume such that each contact portion between the terminal 48a and land 36 is completely covered but deformation of the actuator unit 21 due to excessive spread of the adhesive 56 does not occur.

The adhesive 56 which bonds the FPC 50, 100, 200, 300, 400, 500 to the printhead 70, with the terminal 48a and land 36 in contact with each other, may be otherwise. For instance, the adhesive 56 may be replaced with an adhesive other than a thermosetting one. Alternatively, the adhesive 56 may be replaced with a bonding part in the form of a metallic ball, for instance. Where a metallic ball is used for bonding the terminal 48a with the land 36, the metallic ball is put on the end of the protrusion 51 of the terminal 48a only and not on the land 36, that is, the amount of the conductive material required for bonding the FPC 50, 100, 200, 300, 400, 500 with the individual electrodes 35 is reduced to prevent occurrence of a short-circuit between adjacent individual electrodes.

Further, an electrically conductive adhesive comprising a resin and electrically conductive fine particles dispersed in the resin may be used for the bonding part. Such an electrically conductive adhesive may be put on either of the terminal 48a or the land 36, but to precisely put the adhesive only at desired positions, it is preferable that the adhesive is put on the protrusion 52 of the terminal 48a, not on the land 36. Whether the adhesive is put on the terminal 48a or on the land 36, since the adhesive 56 holding the terminal 48a and land 36 in contact with each other is of an electrically conductive material, the electrical and mechanical connection at the contact portion between the terminal 48a and the land 36 is ensured irrespectively of the condition of the contact, enhancing the electrical and mechanical reliability of the head unit or the apparatus using the head unit.

What is claimed is:

1. An electric device comprising:
   an actuator unit which includes a plurality of electrodes formed thereon;
   a printed wiring board which comprises:
      an electrically insulating flexible layer which has on one of its opposite sides protrusions for the respective electrodes, each of the protrusions forming a corresponding recess on the other side of the flexible layer; and
      a plurality of electrically conducting layers disposed on the respective protrusions to be in contact with the respectively corresponding electrodes; and
   a plurality of bonding parts each of which bonds one of the conducting layers and a corresponding one of the electrodes to keep by a bonding force thereof a state where the end of each protruding portion is in pressing contact with the corresponding electrode and held flattened;
   wherein each of the bonding parts is disposed around the protrusions.

2. The electric device according to claim 1,
   wherein the electrode has a two-layer structure comprising a substrate layer directly on the actuator unit, and a contact layer disposed on the substrate layer to be in contact with the protrusion.

3. The electric device according to claim 1,
   wherein each of a surface of the electrode and a surface of the conducting layer is formed of one of gold, silver, platinum and palladium.

4. The electric device according to claim 1,
   wherein the bonding part is formed of an electrically non-conductive material.

5. The electric device according to claim 1,
   wherein the bonding part is formed of an electrically conductive material.

6. The electric device according to claim 1, further comprising an annular sealing member which is disposed between the actuator unit and the printed wiring board to encircle the protrusions so that a space where the protrusions are present is sealed.

7. The electric device according to claim 1,
   wherein the printed wiring board further comprises a supporting layer attached to the other side of the flexible layer.

8. The electric device according to claim 7,
   wherein the supporting layer is configured to conform to a shape of the recesses.

9. The electric device according to claim 7,
   wherein the supporting layer has a flat shape.

10. The electric device according to claim 9,
    wherein each of the recesses cooperates with the supporting layer to define a closed space therebetween.

11. The electric device according to claim 10,
    wherein the closed space is filled with an elastic material.

12. The electric device according to claim 9,
    wherein each of the recesses cooperates with the supporting layer to define a space therebetween and the space is open to the atmosphere.

13. The electric device according to claim 9,
    wherein the supporting layer has a plurality of protrusions projecting inside the respective recesses.

14. The electric device according to claim 1,
    wherein the actuator unit constitutes a recording head that includes a plurality of recording elements, and the electrodes are formed at respective positions corresponding to the recording elements.

15. The electric device according to claim 14,
    wherein the recording head is a printhead and the recording elements are a plurality of printing elements, and the electrodes are formed at respective positions corresponding to the printing elements.

16. The electric device according to claim 15,
    wherein the printhead is an inkjet printhead and the printing elements are a plurality of sets each comprising an actuating portion, a pressure chamber, and a nozzle, and the electrodes are formed at respective positions corresponding to the sets.

17. The electric device according to claim 1,
    wherein the actuator unit comprises a plurality of actuating portions which are deformable.

18. The electric device according to claim 17,
    wherein the actuator unit includes a plurality of piezoelectric elements as stacked, and the electrodes are formed on an outermost one of the piezoelectric elements.

19. The electric device according to claim 1,
    wherein the actuator unit deforms when operated by application of a voltage to each of the electrodes.

20. The electric device according to claim 1,
    wherein each of the bonding parts completely covers a contact portion between the conducting layer and the electrode.

* * * * *